US 011538905B2

(12) United States Patent
Glass et al.

(10) Patent No.: US 11,538,905 B2
(45) Date of Patent: Dec. 27, 2022

(54) NANOWIRE TRANSISTORS EMPLOYING CARBON-BASED LAYERS

(71) Applicant: INTEL CORPORATION, Santa Clara, CA (US)

(72) Inventors: Glenn A. Glass, Portland, OR (US); Anand S. Murthy, Portland, OR (US); Nabil G. Mistkawi, North Keizer, OR (US); Karthik Jambunathan, Hillsboro, OR (US); Tahir Ghani, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/327,034

(22) PCT Filed: Sep. 30, 2016

(86) PCT No.: PCT/US2016/054708
§ 371 (c)(1),
(2) Date: Feb. 21, 2019

(87) PCT Pub. No.: WO2018/063300
PCT Pub. Date: Apr. 5, 2018

(65) Prior Publication Data
US 2019/0221641 A1    Jul. 18, 2019

(51) Int. Cl.
*H01L 29/06* (2006.01)
*H01L 29/78* (2006.01)
(Continued)

(52) U.S. Cl.
CPC .......... *H01L 29/0673* (2013.01); *B82Y 10/00* (2013.01); *H01L 21/02527* (2013.01);
(Continued)

(58) Field of Classification Search
CPC ........... H01L 29/0673; H01L 21/02527; H01L 21/02532; H01L 21/823412;
(Continued)

(56) References Cited

U.S. PATENT DOCUMENTS 7,781,771 B2    8/2010   Lindert et al.
7,812,394 B2    10/2010  Murthy et al.
(Continued)

FOREIGN PATENT DOCUMENTS

TW          I512836 B       11/2015
WO      2018063300 A1      4/2018

OTHER PUBLICATIONS

SiC properties, http://www.ioffe.ru/SVA/NSM/Semicond/SiC/thermal.html.*
(Continued)

*Primary Examiner* — Peter Bradford
(74) *Attorney, Agent, or Firm* — Schwabe, Williamson & Wyatt, P.C.

(57) ABSTRACT

Techniques are disclosed for forming nanowire transistors employing carbon-based layers. Carbon is added to the sacrificial layers and/or non-sacrificial layers of a multilayer stack forming one or more nanowires in the transistor channel region. Such carbon-based layers reduce or prevent diffusion and intermixing of the sacrificial and non-sacrificial portions of the multilayer stack. The reduction of diffusion/intermixing can allow for the originally formed layers to effectively maintain their original thicknesses, thereby enabling the formation of relatively more nanowires for a given channel region height because of the more accurate processing scheme. The techniques can be used to benefit group IV semiconductor material nanowire devices (e.g., devices including Si, Ge, and/or SiGe) and can also assist with the selective etch processing used to form the
(Continued)

nanowires. The carbon concentration of the sacrificial and/or non-sacrificial layers can be adjusted to facilitate etch process to liberate nanowires in the channel region.

20 Claims, 8 Drawing Sheets

(51) Int. Cl.
  *H01L 29/08* (2006.01)
  *H01L 29/66* (2006.01)
  *H01L 29/423* (2006.01)
  *H01L 29/786* (2006.01)
  *B82Y 10/00* (2011.01)
  *H01L 29/775* (2006.01)
  *H01L 21/02* (2006.01)
  *H01L 21/8234* (2006.01)
  *H01L 29/10* (2006.01)
  *H01L 29/165* (2006.01)

(52) U.S. Cl.
  CPC ............ *H01L 21/02532* (2013.01); *H01L 21/823412* (2013.01); *H01L 21/823431* (2013.01); *H01L 21/823437* (2013.01); *H01L 29/0847* (2013.01); *H01L 29/1033* (2013.01); *H01L 29/165* (2013.01); *H01L 29/42392* (2013.01); *H01L 29/66* (2013.01); *H01L 29/6681* (2013.01); *H01L 29/66439* (2013.01); *H01L 29/66545* (2013.01); *H01L 29/775* (2013.01); *H01L 29/785* (2013.01); *H01L 29/78696* (2013.01)

(58) Field of Classification Search
  CPC ..... H01L 21/823431; H01L 21/823437; H01L 29/0847; H01L 29/1033; H01L 29/165; H01L 29/42392; H01L 29/66; H01L 29/66439; H01L 29/66545; H01L 29/6681; H01L 29/775; H01L 29/785; H01L 29/78696; B82Y 10/00
  See application file for complete search history.

(56) References Cited

U.S. PATENT DOCUMENTS

| | | | |
|---|---|---|---|
| 9,425,318 B1* | 8/2016 | Hoentschel | H01L 29/66545 |
| 2004/0217430 A1* | 11/2004 | Chu | H01L 21/2807 257/410 |
| 2008/0173864 A1 | 7/2008 | Fujita et al. | |
| 2011/0108804 A1 | 5/2011 | Bangsaruntip et al. | |
| 2013/0277714 A1* | 10/2013 | Le | H01L 29/42392 257/190 |
| 2013/0341722 A1* | 12/2013 | Illgen | H01L 21/84 257/351 |
| 2014/0034908 A1 | 2/2014 | Bangsaruntip et al. | |
| 2014/0051213 A1* | 2/2014 | Chang | B82Y 10/00 438/151 |
| 2014/0319615 A1* | 10/2014 | Chi | H01L 29/7853 257/365 |
| 2015/0179781 A1* | 6/2015 | Chang | H01L 29/7848 438/151 |
| 2016/0027870 A1* | 1/2016 | Cheng | H01L 29/66545 257/347 |
| 2016/0027929 A1* | 1/2016 | Cheng | H01L 29/78696 257/9 |
| 2016/0086951 A1* | 3/2016 | Kim | H01L 21/84 257/351 |
| 2016/0141361 A1* | 5/2016 | Wang | H01L 29/775 257/9 |
| 2016/0260802 A1 | 9/2016 | Glass et al. | |

OTHER PUBLICATIONS

Chemistry stackexchange, https://chemistry.stackexchange.com/questions/19621/are-there-carbon-silicon-alloys, 2014.*
International Search Report and Written Opinion received for PCT/US2016/054708, dated Jun. 29, 2017. 13 pages.
International Preliminary Report on Patentability received for PCT/US2016/054708, dated Apr. 2, 2019. 9 pages.
Office Action from Taiwan Patent Application No. 106128148, dated Mar. 17, 2021, 32 pgs.
Office Action from Taiwan Patent Application No. 106128148, dated Nov. 24, 2021, 20 pgs., with English translation.
Office Action from Taiwan Patent Application No. 106128148, dated Apr. 19, 2022, 7 pgs.

* cited by examiner

NANOWIRE TRANSISTORS EMPLOYING CARBON-BASED LAYERS

BACKGROUND

Semiconductor devices are electronic components that exploit the electronic properties of semiconductor materials, such as silicon (Si), germanium (Ge), and gallium arsenide (GaAs), to name a few examples. A field-effect transistor (FET) is a semiconductor device that includes three terminals: a gate, a source, and a drain. A FET uses an electric field applied by the gate to control the electrical conductivity of a channel through which charge carriers (e.g., electrons or holes) flow from the source to the drain. In instances where the charge carriers are electrons, the FET is referred to as an n-channel device, and in instances where the charge carriers are holes, the FET is referred to as a p-channel device. Some FETs have a fourth terminal called the body or substrate, which can be used to bias the transistor. A metal-oxide-semiconductor FET (MOSFET) is configured with an insulator between the gate and the body of the transistor, and MOSFETs are commonly used for amplifying or switching electronic signals. In some cases, MOSFETs include sidewall or so-called gate spacers on either side of the gate that can help determine the channel length and can help with replacement gate processes, for example. Complementary MOS (CMOS) structures typically use a combination of p-channel MOSFETs (p-MOS) and n-channel MOSFETs (n-MOS) to implement logic gates and other digital circuits.

A FinFET is a MOSFET transistor built around a thin strip of semiconductor material (generally referred to as a fin). The conductive channel of the FinFET device resides on the outer portions of the fin adjacent to the gate dielectric. Specifically, current runs along/within both sidewalls of the fin (sides perpendicular to the substrate surface) as well as along the top of the fin (side parallel to the substrate surface). Because the conductive channel of such configurations essentially resides along the three different outer, planar regions of the fin, such a FinFET design is sometimes referred to as a tri-gate transistor. Other types of FinFET configurations are also available, such as so-called double-gate FinFETs, in which the conductive channel principally resides only along the two sidewalls of the fin (and not along the top of the fin). A nanowire transistor (sometimes referred to as a gate-all-around (GAA) or nanoribbon transistor) is configured similarly to a fin-based transistor, but instead of a finned channel region where the gate is on three portions (and thus, there are three effective gates), one or more nanowires are used for the channel region and the gate material generally surrounds each nanowire.

BRIEF DESCRIPTION OF THE DRAWINGS

FIGS. 1H' and 1H" illustrate example alternative nanowire cross-sectional geometries relative to the nanowire of FIG. 1H, in accordance with some embodiments.

Figure 1A:
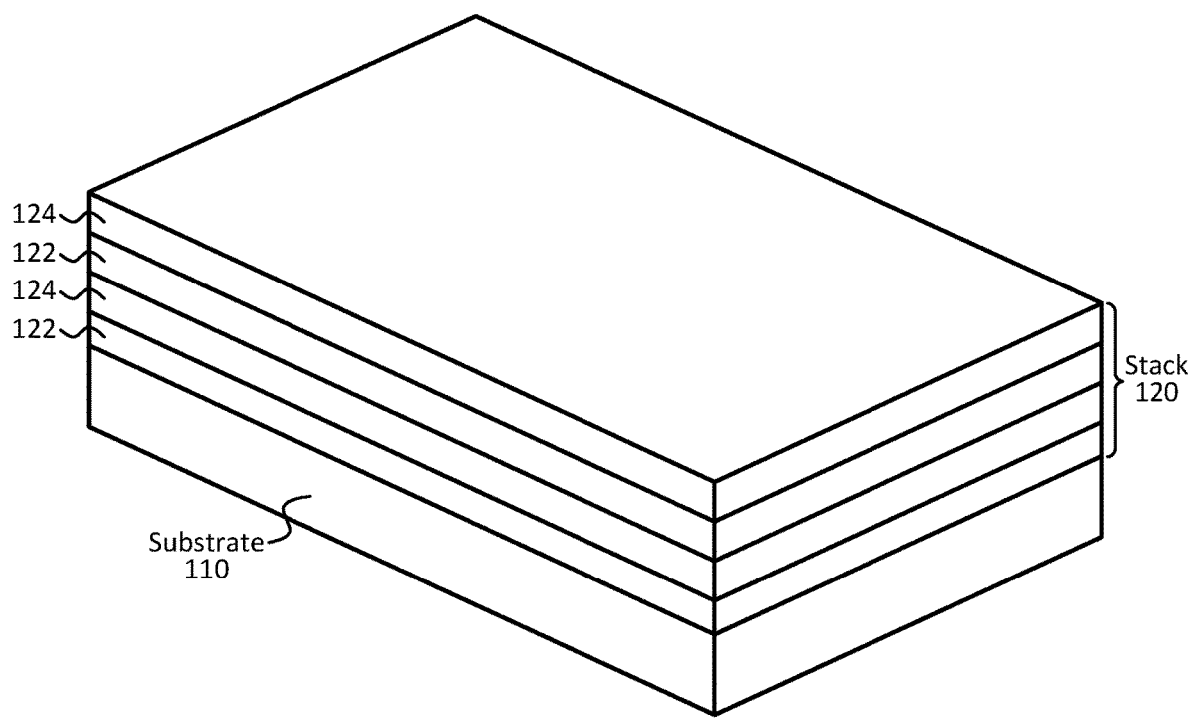
FIGS. 1A-L illustrate example integrated circuit (IC) structures resulting from a method configured to form nanowire transistors employing carbon-based layers, in accordance with some embodiments of the present disclosure.

These and other features of the present embodiments will be understood better by reading the following detailed description, taken together with the figures herein described. In the drawings, each identical or nearly identical component that is illustrated in various figures may be represented by a like numeral. For purposes of clarity, not every component may be labeled in every drawing. Furthermore, as will be appreciated, the figures are not necessarily drawn to scale or intended to limit the described embodiments to the specific configurations shown. For instance, while some figures generally indicate straight lines, right angles, and smooth surfaces, an actual implementation of the disclosed techniques may have less than perfect straight lines and right angles, and some features may have surface topography or otherwise be non-smooth, given real-world limitations of fabrication processes. For instance, fins or multilayer stacks as variously provided herein may be tapered in their cross-sectional profile, such that they are wider at the bottom proximate the substrate and narrower at the top. In short, the figures are provided merely to show example structures and methodology.

DETAILED DESCRIPTION

Group IV semiconductor materials, which include silicon (Si), germanium (Ge), and silicon germanium (SiGe), to name some examples, can be used to form nanowire transistors. Nanowire transistors can be formed by using a stack of alternating material layers where one of the sets of material layers in the stack is sacrificial or inactive. The stack of alternating material layers can be formed into fin-shaped stacks, where the sacrificial material layers in the fin stack are removed to form nanowires of the non-sacrificial material layers in the channel region of a transistor. However, processing that occurs between forming the stack of alternating material layers and forming the nanowires (such as any included annealing) can cause diffusion and intermixing between the sacrificial and non-sacrificial material layers in the stack. Such diffusion (or intermixing) is undesired, as it can cause the sacrificial portion of the stack to expand, thereby increasing the spacing between the nanowires in the final device. Further, the selective etch process used to remove the sacrificial portion of the stack may undesirably remove material from the non-sacrificial layers, thereby increasing spacing between the nanowires in the final device. Thus, the minimum spacing practically achievable for nanowire configurations is increased (e.g., to 5 nm or more) as a result of the undesired diffusion and/or the selective etch process used, which is a waste of available space in the channel region due to limitations that exist for the channel region maximum height. Reducing the undesired diffusion and/or improving the selectivity of the selective etch process used would lead to a reduction of the wasted space in the channel region and thus enable relatively more nanowires in a given channel region, thereby improving the transistor device performance.

Thus, and in accordance with one or more embodiments of the present disclosure, techniques are provided for forming nanowire transistors employing carbon-based layers. Recall that nanowire transistors can be formed using a stack of alternating material layers where one set of the layers is intended to be sacrificial and the other set is intended to be non-sacrificial, such that the sacrificial layers can be removed via selective etch to leave the non-sacrificial layers to be used as nanowires in the channel region of the transistor. The stack can be formed, for example, in a blanket deposition process where the stack is then etched into multilayer fins, or alternatively by using aspect ratio trapping (ART) where fins native to a given substrate are recessed-and-replaced with a multilayer fins having alternating non-sacrificial and sacrificial layers. In any such embodiments, carbon may be added to either or both the sacrificial layers or the non-sacrificial layers of the multilayer stack to reduce or prevent diffusion and intermixing of the sacrificial and non-sacrificial portions of the multilayer stack. In this manner, the carbon included in the stack acts as a barrier to diffusion. In some such embodiments, the reduction or prevention of diffusion/intermixing can allow for the originally formed layers to effectively maintain their original thicknesses, thereby enabling the formation of relatively more nanowires for a given channel region height because of the more accurate processing scheme. In other words, without the inclusion of carbon in one set of the layers in the stack, the diffusion/intermixing would have to be accounted for in original stack formation to compensate for the undesired additional nanowire spacing caused by the diffusion/intermixing, for example. Further, in embodiments where carbon is added to the non-sacrificial layers in the multilayer stack, the presence of carbon in the non-sacrificial layers makes those layers more resistant to the selective etch processing used to remove the sacrificial layers in the stack, as can be understood based on this disclosure. As will be further appreciated, in embodiments where carbon is added to the sacrificial layers in the multilayer stack, the presence of carbon in the sacrificial layers can provide additional options for removing that sacrificial material via selective etch processing.

Generally, the use of "group IV semiconductor material" (or "group IV material" or generally, "IV") herein includes at least one group IV element (e.g., silicon, germanium, carbon, tin, lead), such as Si, Ge, SiGe, and so forth. In some embodiments, the techniques may be used to benefit nanowire transistors formed using alternating stacks of group IV semiconductor material, such as Si, Ge, and SiGe, for example. Thus, in some such embodiments, carbon may be added to one set of the alternating stack of layers by alloying that set with carbon content. In instances where monocrystalline Si, Ge, or SiGe, to name some example group IV materials, are alloyed with a dilute concentration of carbon (C), those materials may be referred to herein as Si:C, Ge:C, and SiGe:C, respectively. Generally, the use of "Z:C" herein may be used to denote an element or compound "Z" alloyed with carbon (C), as opposed to carbide compounds. In some embodiments, example sacrificial/non-sacrificial material layer sets include, but are not limited to, Si:C/Si, Si/Si:C, Si:C/SiGe, SiGe/Si:C, SiGe:C/Si, Si/SiGe:C, SiGe:C/SiGe, SiGe/SiGe:C, SiGe:C/Ge, Ge/SiGe:C, SiGe/Ge:C, Ge:C/SiGe, Ge:C/Ge, and Ge/Ge:C, to provide some examples. In some embodiments, the dilute concentration of carbon in the Z:C material may be less than 5, 4, 3, 2, or 1 percent of the total atomic percentage of the Z:C material (e.g., less than 2 percent). However, in some embodiments, higher carbon alloy concentration may be used (e.g., up to 20% C), such as in embodiments employing relatively thin layers in the multilayer stack (e.g., layers having a thickness of less than 2 nm). In some embodiments, the techniques enable the formation of nanowires that are less than 5 nm apart (e.g., only 2 nm apart), which may be otherwise unachievable without the addition of carbon to the multilayer stack of layers used to form the nanowires, as can be understood based on this disclosure. In some instances, nanowires may also (or alternatively) be considered nanoribbons, and in any such case, a transistor employing a nanowire/nanoribbon channel region can be considered to have a gate-all-around (GAA) configuration, as the gate at least substantially wraps around each nanowire/nanoribbon (e.g., wraps around at least 70, 80, 90, or 95 percent of each nanowire/nanoribbon). The techniques described herein are applicable to GAA transistors including any number of nanowires/nanoribbons.

Use of the techniques and structures provided herein may be detectable using tools such as: electron microscopy including scanning/transmission electron microscopy (SEM/TEM), scanning transmission electron microscopy (STEM), nano-beam electron diffraction (NBD or NBED), and reflection electron microscopy (REM); composition mapping; x-ray crystallography or diffraction (XRD); energy-dispersive x-ray spectroscopy (EDS); secondary ion mass spectrometry (SIMS); time-of-flight SIMS (ToF-SIMS); atom probe imaging or tomography; local electrode atom probe (LEAP) techniques; 3D tomography; or high resolution physical or chemical analysis, to name a few suitable example analytical tools. In particular, in some embodiments, such tools may indicate an integrated circuit (IC) including a transistor having a nanowire (or nanoribbon or gate-all-around (GAA)) configuration that includes a nanowire including group IV semiconductor material (e.g., Si, Ge, or SiGe) having an alloy of carbon (C), such that carbon constitutes only a portion the nanowire material (e.g., less than 5, 4, 3, 2, or 1 percent of nanowire material, by atomic percentage). In some embodiments, carbon may not be present in any of the nanowires included in the channel region of the end transistor device, as the carbon-based layers may be sacrificial and thus they are removed during the transistor fabrication process. In some such embodiments, the techniques may be detected, for example, through detection of a multilayer fin-shaped stack as variously described herein being present on the same substrate (or die or wafer) as the nanowire transistor as a result of it being an unused remnant of the processing. In some embodiments, use of the techniques herein may be detected based on the minimum distance between two nanowires being less than 5, 4, 3, or 2 nm, for example. As can be understood based on this disclosure, such small distances between nanowires may not be achievable without using the techniques described herein that employ carbon-based layers. In some embodiments, the techniques and IC structures described herein may be detected based on the benefits they provide, such as the diffusion barrier benefits that assist with forming more accurate nanowires and spaces therebetween, for example. Numerous configurations and variations will be apparent in light of this disclosure.

Methodology and Architecture

FIGS. 1A-L illustrate example integrated circuit (IC) structures resulting from a method configured to form nanowire transistors employing carbon-based layers, in accordance with some embodiments of the present disclosure. The structures of FIGS. 1A-L are illustrated in the context of forming nanowire (or nanoribbon or gate-all-around (GAA)) transistors including two nanowires/nanoribbons, for ease of illustration. However, the techniques may be used to form nanowire transistors including any number of nanowires/nanoribbons, such as 1-10, or more, in accordance with some embodiments. As will be apparent in light of this disclosure, in some embodiments, the method includes forming a multilayer fin structure of alternating layers of sacrificial and non-sacrificial material, where the one or more non-sacrificial material layers are intended to be formed into nanowires/nanoribbons by removing the intervening sacrificial material layers via selective etch processing, in accordance with some embodiments. In some embodiments, the nanowires/nanoribbons may only be present in the channel region of the final transistor device, while in other embodiments, some or all of the nanowire/nanoribbon layers may also be present in one or both of the source/drain (S/D) regions, as will be apparent in light of this disclosure. Various example transistor types that can benefit from the techniques described herein include, but are not limited to, field-effect transistors (FETs), metal-oxide-semiconductor FETs (MOSFETs), and tunnel-FETs (TFETs). In addition, the techniques can be used to benefit p-type devices (e.g., p-MOS) and/or n-type devices (e.g., n-MOS). Further, the techniques may be used to benefit various transistor-based devices, such as quantum devices (few to single electron) or complementary MOS (CMOS) devices/circuits, where either or both of the included p-type and n-type transistors may be formed using the techniques described herein (e.g., formed with a nanowire configuration employing carbon-based layers), for example. In some embodiments, the techniques may be used to benefit devices of varying scales, such as IC devices having critical dimensions in the micrometer (micron) range and/or in the nanometer (nm) range (e.g., formed at the 22, 14, 10, 7, 5, or 3 nm process nodes, or beyond).

FIG. 1A illustrates an example IC structure including substrate 110 with a stack 120 of alternating material layers 122/124 formed thereon, in accordance with an embodiment. In some embodiments, substrate 110 may include: a bulk substrate including group IV semiconductor material, such as silicon (Si), germanium (Ge), or silicon germanium (SiGe), and/or any other suitable semiconductor material(s); an X on insulator (XOI) structure where X includes group IV material (and/or other suitable semiconductor material) and the insulator material is an oxide material or dielectric material or some other electrically insulating material; or some other suitable multilayer structure where the top layer includes group IV material and/or other suitable semiconductor material. Recall that the use of "group IV semiconductor material" (or "group IV material" or generally, "IV") herein includes at least one group IV element (e.g., silicon, germanium, carbon, tin, lead), such as Si, Ge, SiGe, and so forth. Note that group IV may also be known as the carbon group or IUPAC group 14, for example. In some embodiments, substrate 110 may include a surface crystalline orientation described by a Miller Index plane of (001), (011), or (111), for example, as will be apparent in light of this disclosure. Although substrate 110, in this example embodiment, is shown as having a thickness (dimension in the Z-axis direction) similar to layers 122 and 124 for ease of illustration, in some instances, substrate 110 may be much thicker than the other layers, such as having a thickness in the range of 50 to 950 microns, for example, which may be at least 100 times thicker than layers 122 and 124, or any other suitable thickness as will be apparent in light of this disclosure. However, in embodiments where substrate 110 is just the top layer of a multilayer substrate structure (and thus, substrate 110 is essentially a pseudo-substrate), that top layer need not be so thick and may be relatively thinner, such as having a thickness in the range of 20 nm to 10 microns, for example. In some cases, the original thickness of substrate 110 may be reduced as a result of processing in, on and/or above the substrate 110. In some embodiments, substrate 110 may be used for one or more other integrated circuit (IC) devices, such as various diodes (e.g., light-emitting diodes (LEDs) or laser diodes), various transistors (e.g., MOSFETs or TFETs), various capacitors (e.g., MOSCAPs), various microelectromechanical systems (MEMS), various nanoelectromechanical systems (NEMS), various sensors, and/or any other suitable semiconductor or IC devices, depending on the end use or target application. Accordingly, in some embodiments, the transistor structures described herein may be included in a system-on-chip (SoC) application, as will be apparent in light of this disclosure.

In some embodiments, alternating layers 122 and 124 in multilayer stack 120 may be formed using any suitable techniques, such as depositing/growing the layers, one at a time, using molecular-beam epitaxy (MBE), chemical vapor deposition (CVD), atomic layer deposition (ALD), physical vapor deposition (PVD), and/or any other suitable process as will be apparent in light of this disclosure. Recall that multilayer stack 120 is intended to be later formed into nanowires for use in the channel region of one or more transistors, in this example embodiment. Further, in this example embodiment, layers 122 are intended to be sacrificial and layers 124 are intended to be formed into and used for the nanowires/nanoribbons, as will be apparent in light of this disclosure. Therefore, as shown in FIG. 1A, the bottom-most layer of stack 120 is sacrificial layer 122 and the top-most layer is non-sacrificial layer 124. However, the present disclosure is not intended to be so limited. For instance, stack 120 may alternatively have a first-formed/bottom-most layer of non-sacrificial material and/or a last-formed/top-most layer of sacrificial material, in accordance with some embodiments. In an embodiment employing the last-formed/top-most layer as sacrificial material, that sacrificial layer may be formed to protect the top-most non-sacrificial layer in the stack prior to selective etch processing used to form the nanowire(s) in the channel region, for example. In some embodiments, stack 120 may include more than two material layers, such as at least three different material layers, in any desired configuration to achieve a nanowire configuration for use in the channel region of a transistor, as can be understood based on this disclosure. In some such embodiments, the use of at least three different material layers may allow for different spacing between the final nanowires (e.g., via multiple selective etch processes) and/or allow for final nanowires of varying materials in the channel region, for example. As can be understood based on this disclosure, the desired number of nanowires may dictate the number of alternating sacrificial layer 122/non-sacrificial layer 124 sets initially formed (e.g., if 3 nanowires are desired, 3 sets of 122/124 layers may be initially formed, if 5 nanowires are desired, 5 sets of 122/124 layers may be initially formed, and so forth).

In some embodiments, sacrificial layers 122 and non-sacrificial layers 124 may have any suitable thicknesses (dimension in the Z-axis direction), such as thicknesses in the range of 1-100 nm (e.g., 2-10 nm), or any other suitable thickness as will be apparent in light of this disclosure. As can be understood based on this disclosure, the thicknesses of layers 122 and 124 will largely determine the final thicknesses of the one or more nanowires formed in the channel region of a transistor and the spaces therebetween (as well as the space between the bottom-most nanowire and substrate 100). Although layers 122 and 124 are all shown in the example embodiment of FIG. 1A as having the same thicknesses, the present disclosure is not intended to be so limited. For instance, in some embodiments, sacrificial layers 122 may all include similar thicknesses (e.g., plus/minus 1, 2, or 3 nm from their average thickness) and non-sacrificial layers 124 may all include similar thicknesses (e.g., plus/minus 1, 2, or 3 nm from their average thickness), but sacrificial layers 122 and non-sacrificial layers 124 may include different relative thicknesses, such that sacrificial layers 122 are thicker or thinner relative to non-sacrificial layers 124 (e.g., relatively at least 1, 2, 3, 4, 5, 6, 7, 8, 9, or 10 nm thicker or thinner, or some other suitable minimum threshold relative difference).

In some such embodiments, the thickness difference between the sacrificial layers 122 and non-sacrificial layers 124 may be employed to achieve a desired end configuration, including desired nanowire thicknesses and desired spacing distance between nanowires, for example. In some embodiments, sacrificial layers 122 and/or non-sacrificial layers 124 may include varying thicknesses, such that all sacrificial layers 122 need not include relatively similar thicknesses (e.g., two sacrificial layers 122 may have relative thickness differences of greater than 1, 2, 3, 4, or 5 nm) and/or all non-sacrificial layers 124 need not include relatively similar thicknesses (e.g., two non-sacrificial layers 124 may have relative thickness differences of greater than 1, 2, 3, 4, or 5 nm). For instance, in some such embodiments, the bottom-most sacrificial layer 122 may be relatively thicker than other sacrificial layers 122 in stack 120 (only one other sacrificial layer, in this example embodiment, but could be multiple other sacrificial layers in other embodiments), to provide an increased buffer between the bottom-most nanowire formed and substrate 110 after the sacrificial material is removed, for example. In some embodiments, the thickness of at least one layer in multilayer stack 120 may be selected such that the thickness of that at least one layer is below the critical thickness of the material of the at least one layer, to help prevent dislocations from forming. In some such embodiments, where the at least one layer may be grown pseudomorphically (below the critical thickness of the included material beyond which dislocations form), additional material schemes may be utilized, such as employing materials that are lattice mismatched, for example. In some embodiments, it may be desired to form dislocations in at least one layer of multilayer stack 120, such as in the sacrificial layers 122 (e.g., to assist with their subsequent removal during the selective etch processing in the channel region). Numerous different thickness schemes for the sacrificial and non-sacrificial layers in multilayer stack 120 will be apparent in light of this disclosure.

In some embodiments, sacrificial layers 122 and non-sacrificial layers 124 may include any suitable material, such as group IV semiconductor material, for example. For instance, in some embodiments, sacrificial layers 122 and non-sacrificial layers 124 may include at least one of Si and Ge, such that each layer includes at least either Si, Ge, or SiGe. In embodiments where SiGe material is included in one or more layers of stack 120, any Ge concentration may be used in the SiGe compound, such that the SiGe may be represented as $Si_{1-x}Ge_x$ where $0<x<1$, for instance. In some embodiments, sacrificial layers 122 and non-sacrificial layers 124 may all include similar material (e.g., all include Si or all include Ge), but one of the sets of layers (sacrificial layers 122 or non-sacrificial layers 124) may also include dilute carbon alloying, for example. In some embodiments, all of sacrificial layers 122 may include similar material, such as each layer including Si, Ge, SiGe (with or without dilute carbon alloy), for example. In some embodiments, all of the non-sacrificial layers 124 may include similar material, such as each layer including Si, Ge, or SiGe (with or without dilute carbon alloy), for example. In some embodiments, one or both of the sets of layers (sacrificial layers 122 and/or non-sacrificial layers 124) may include dissimilar material within layers in a single set. For instance, in some embodiments, non-sacrificial layers 124 may include dissimilar material in the set, such as one of the layers including Si and another including Ge, such that nanowires of varying materials in the same transistor can be employed, to provide an example.

In some embodiments, one or more of the layers included in the multilayer stack 120 may include impurity dopants using any suitable doping scheme, such as doping one or more of the layers using suitable n-type dopants and/or doping one or more of the layers using suitable p-type dopants, for example. In some such embodiments, impurity dopants may be introduced via diffusion and/or ion implantation, for example, and/or via any other suitable techniques. However, in some embodiments, the layers in stack 120 need not include doping (e.g., neither of n-type or p-type dopants), such that the material in the layers are intrinsic or end up being only nominally undoped (e.g., with dopant concentrations of less than 1E18 atoms per cubic centimeter or some other maximum threshold dopant concentration). In some such embodiments, it may be desired that the layers in stack 120 (which includes layers to be in the final channel region of the transistor device) be intrinsic for use in a TFET device, as TFET devices generally include a source-channel-drain doping scheme of p-i-n or n-i-p, where 'P' stands for p-type doped material, 'n' stands for n-type material, and T stands for intrinsic material. In some embodiments, one or more of the layers included in multilayer stack 120 (e.g., one or more of the sacrificial layers 122 and/or non-sacrificial layers 124) may include grading (e.g., increasing and/or decreasing) the content of one or more materials in the layer. Further, in some embodiments, one or more of the layers included in multilayer stack 120 may have a multilayer structure including at least two material layers, depending on the end use or target application. Further still, additional layers may be present in multilayer stack 120, such as one or more isolation layers (e.g., including dielectric/insulating material) that may be employed to help isolate portions of the final nanowire configuration, for example. Numerous different material and layer configurations for multilayer stack 120 will be apparent in light of this disclosure.

In some embodiments, one of the sets of layers (either sacrificial layers 122 or non-sacrificial layers 124) may include a dilute concentration of carbon alloy, where the concentration is less than 5, 4, 3, 2, or 1 percent of the total atomic percent of the material. The alloying may be achieved using any suitable technique(s). Material including a dilute concentration of carbon (C) alloy may be represented as "Z:C" herein, where "Z" is an element or compound. In some embodiments, example sacrificial/non-sacrificial (122/124) layer sets include, but are not limited to, Si:C/Si, Si/Si:C, Si:C/SiGe, SiGe/Si:C, SiGe:C/Si, Si/SiGe:C, SiGe:C/SiGe, SiGe/SiGe:C, SiGe:C/Ge, Ge/SiGe:C, SiGe/Ge:C, Ge:C/SiGe, Ge:C/Ge, and Ge/Ge:C, to provide some examples. In some embodiments, carbon may be added to both layer sets, such that example sacrificial/non-sacrificial (122/124) layer sets include, but are not limited to, Si:C/SiGe:C, SiGe:C/Si:C, SiGe:C/Ge:C, and Ge:C/SiGe:C, for instance. In embodiments where carbon is included in both sacrificial layers 122 and non-sacrificial layers 124, the C content and/or Ge content may be adjusted in each set of layers to facilitate the selective etch processing, for example. For instance, in some such embodiments, the carbon content may be relatively lower in the sacrificial layers 122 than the non-sacrificial layers 124 to help the sacrificial layer material be selectively removed. In some embodiments, carbon may be alloyed with either the material of sacrificial layers 122 or the material of the non-sacrificial layers 124 of multilayer stack 120 to reduce or prevent diffusion and intermixing of the material of the sacrificial and non-sacrificial portions of the stack 120. In this manner, the carbon included in the stack acts as a barrier to diffusion to preserve the original layer thicknesses and configuration of stack 120 throughout the transistor fabrication process flow. In some such embodiments, the reduction or prevention of diffusion/intermixing can allow for the originally formed layers to effectively maintain their original thicknesses (or practically maintain thicknesses that are more accurate to their originally deposited thicknesses than if carbon was not employed), thereby enabling the formation of relatively more nanowires for a given channel region height because of the more accurate processing scheme. In other words, without the inclusion of carbon in one set of the layers in the stack, the diffusion/intermixing would have to be accounted for in original stack formation to compensate for the undesired additional nanowire spacing caused by the diffusion/intermixing, for example.

In embodiments where carbon is added to the non-sacrificial layers 124 in the multilayer stack, the presence of carbon in those non-sacrificial layers 124 makes them more resistant to the selective etch processing used to remove the sacrificial layers 122 in the stack, as can be understood based on this disclosure. In embodiments where carbon is added to the sacrificial layers 122 in the multilayer stack, the presence of carbon in those sacrificial layers 122 can provide additional options for removing that sacrificial material via selective etch processing, as can also be understood based on this disclosure. Note that when carbon is added to a set of layers in stack 120 (e.g., either sacrificial layers 122 or non-sacrificial layers 124), carbon need not be added to each layer in that set. Further, in some embodiments, carbon may only be included in a sub-set of the set the carbon alloy is included in (e.g., in some amount of layers that is less than at least one layer relative to the total number of layers in the set). By way of example, using the structure of FIG. 1A, carbon may be included in only the top or bottom sacrificial layer or included in only the top or bottom non-sacrificial layer, in such an embodiment. Moreover, in embodiments employing more than three sacrificial/non-sacrificial layer sets, carbon may be included in only one or two of the top, middle, and bottom sacrificial or non-sacrificial layers, and so forth for embodiments employing more alternating layer sets. Further still, in some embodiments, carbon may be added to both sets of layers (e.g., both the set of sacrificial layers 122 and the set of non-sacrificial layers 124), such as in embodiments employing different base material in the different layer sets. For example, sacrificial layers 122 may include X1:C and non-sacrificial layers 124 may include X2:C, where X1 is not the same as X2. In some such embodiments, carbon need not be added to each layer in each set. For instance, in some such embodiments, carbon may only be included in a sub-set of each set of sacrificial layers 122 and non-sacrificial layers 124. By way of example, using the structure of FIG. 1A, carbon may be included in only the top or bottom sacrificial layer and only in the top or bottom non-sacrificial layer, in such an embodiment.

Figure 1B:
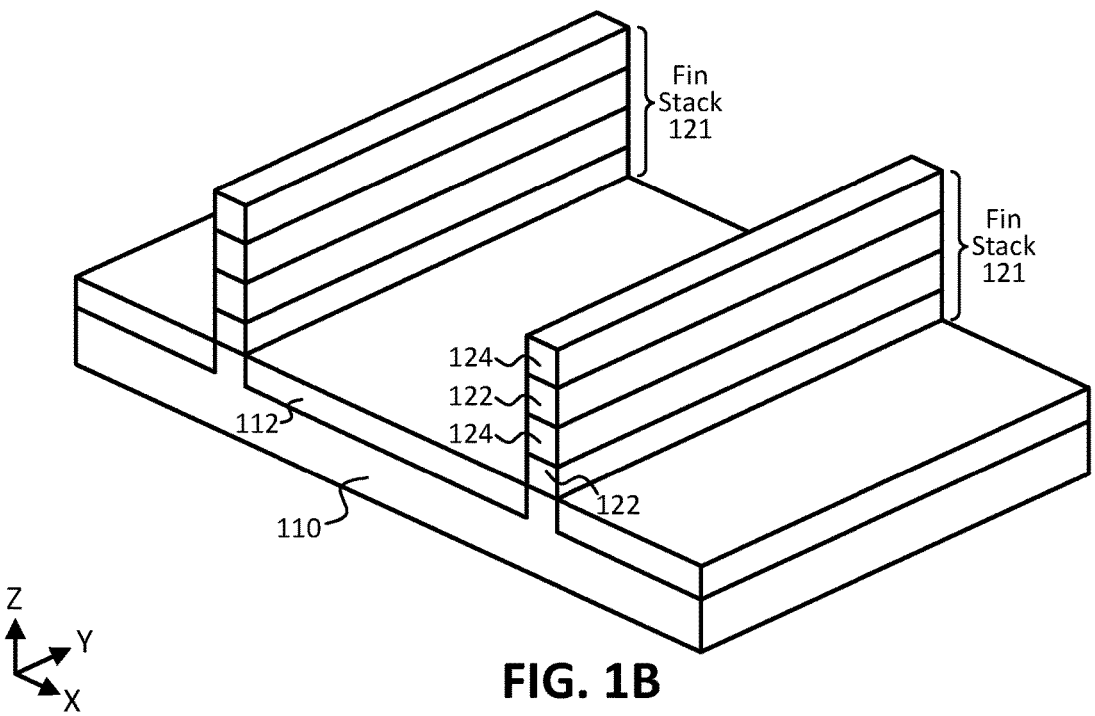

FIG. 1B illustrates an example resulting IC structure after the multilayer stack 120 in the structure of FIG. 1A is formed into one or more fins, in accordance with an embodiment. As shown in this example embodiment, stack 120 was formed into two fin-shaped stacks 121. In some embodiments, any suitable processing may be used to form fins stacks 121, such as patterning (using lithography and etching) stack 120 into the fin stacks 121 shown, for example. Such a patterning process may be similar to a shallow trench recess (STR) process that is employed to form finned (e.g., tri-gate or FinFET) transistors. Any number of lithography and etch processes may to pattern the fin stacks 121, in accordance with some embodiments. Although only two fin stacks 121 are shown in FIG. 1B for ease of illustration, the IC structure may include any number of fin stacks formed from multilayer stack 120, such as 1-100, hundreds, thousands, millions, or more, as the devices to be formed can be on the nanotechnology scale, as can be understood based on this disclosure. As shown in FIG. 1B, the left and right fin stacks 121 include similar heights (dimension in the Z-axis direction) and widths (dimension in the X-axis direction). However, the present disclosure is not intended to be so limited. For instance, in some embodiments, the fin stacks 121 (when there are multiple fin stacks included) may be formed to have varying heights and/or varying widths. As is also shown in FIG. 1B, the structure includes optional shallow trench isolation (STI) layer 112, which may be formed using any suitable techniques. For instance, STI layer 112, when present, may be formed by etching into substrate 110 to form fins of native material and depositing the STI layer 112 material as shown, in accordance with some embodiments. In other embodiments, STI layer 112 may be deposited between the fin stacks 121 and then recessed, and in some such embodiments, STI layer 112 may be level with at least a portion of the bottom sacrificial layer 122, for example, as opposed to being level with native portions of substrate 110, for instance. However, in some embodiments (e.g., embodiments where substrate 110 is an XOI substrate), STI layer 112 may be absent, as can be understood based on this disclosure.

In some embodiments, fin stacks 121 may be formed using other suitable processing. For instance, in an example embodiment, the fins may be formed by forming fins in substrate 110 (fins native to the substrate), forming STI material between the native fins, removing at least a portion of the native fins to form fin trenches, and depositing the multilayer stack in the fin trenches, and recessing (or removing) the STI material (e.g., to form fin stacks as shown in FIG. 1B). In such an example embodiment, STI material may be present between the fin stacks and such STI material may include any suitable dielectric, oxide (e.g., silicon dioxide), nitride (e.g., silicon nitride), and or other electrically insulating material, for example. Further, such an example embodiment may employ an aspect ratio trapping (ART) scheme, where the native fins are formed to have a particular height to width ratio (e.g., greater than 1.5, 2, 3, 4, 5, 10, or some other suitable ratio) such that when they are later removed or recessed, the resulting fin trenches formed allow for any defects that may otherwise be present in the replacement multilayer fin stack to terminate on a side surface (e.g., a surface of the STI material) as the material grows vertically. Regardless of the processing used to form fin stacks 121, in some embodiments, STI material may be present between two such fin stacks 121 to provide electrical isolation therebetween, for example. However, the embodiment shown in FIG. 1B does not include such STI material and thus, it need not be present in some embodiments. Note that although the fin stacks 121 are shown as generally having a rectangular shape with 90 degree angles, such a shape is used for ease of illustration and the present disclosure is not intended to be so limited.

Figure 1C:
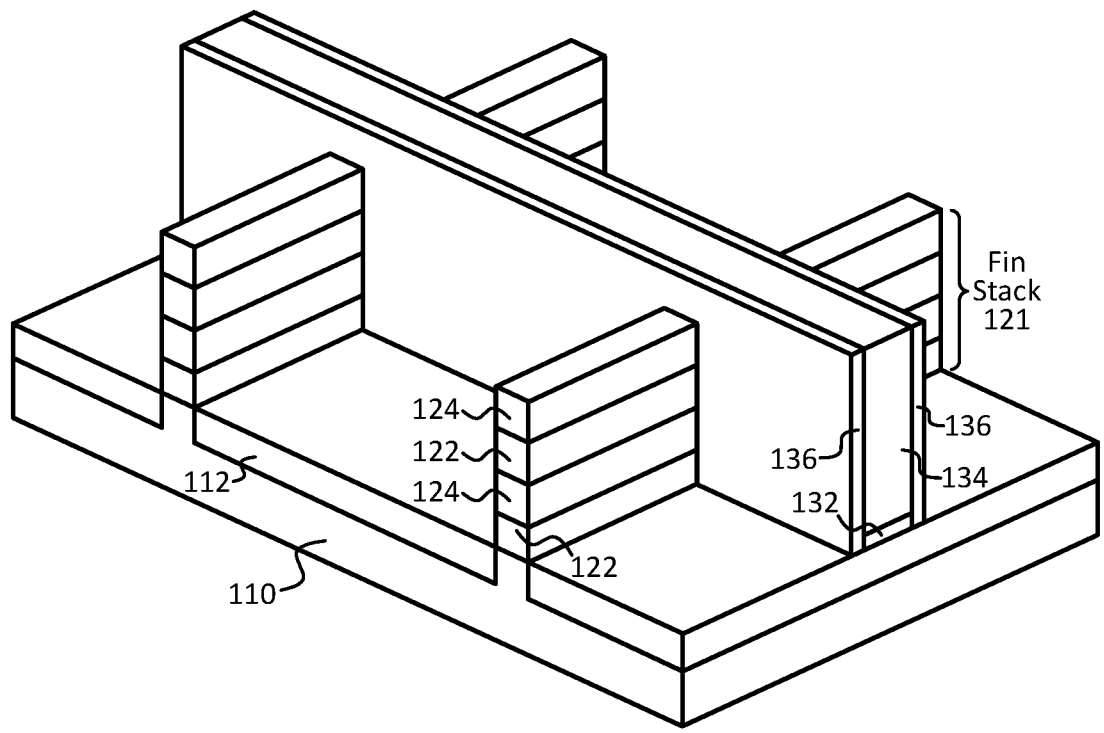

FIG. 1C illustrates an example resulting IC structure after a dummy gate stack is formed on the structure of FIG. 1B, in accordance with an embodiment. In this example embodiment, dummy gate dielectric layer 132 and dummy gate 134 include sacrificial material (e.g., dummy poly-silicon for the gate 134) to be later removed and replaced in a replacement gate process. Such a gate last process flow is utilized in this example embodiment to allow for processing of the channel region into one or more nanowires when the channel region is exposed after removal of the dummy gate stack and prior to the formation of the final gate stack, as will be apparent in light of this disclosure. In some embodiments, formation of the dummy gate stack may be performed using any suitable techniques, such as depositing the dummy gate dielectric layer 132 and dummy gate (also referred to as dummy gate electrode) layer 134, patterning the dummy layers 132 and 134 into a dummy gate stack, depositing gate spacer material, and performing a spacer etch to form spacers 136 on either side of the dummy gate stack, shown in FIG. 1F, for example. Spacers 136 (also referred to as gate spacers or sidewall spacers) can help determine the channel length and can also help with replacement gate processes, for example. As can be understood based on this disclosure, the dummy gate stack (and spacers 136) helps to define the channel region and source/drain (S/D) regions of each fin stack 120, where the channel region is below the dummy gate stack (as it will be located below the final gate stack), and the S/D regions are adjacent to and on either side of the channel region. Spacers 136 may include any suitable material, such as any suitable electrical insulator, dielectric, oxide (e.g., silicon oxide), and/or nitride (e.g., silicon nitride) material, as will be apparent in light of this disclosure. In some embodiments, a hardmask may be formed on dummy gate 134 and/or on spacers 136, which may be included to protect those features during subsequent processing, for example.

Figure 1D:
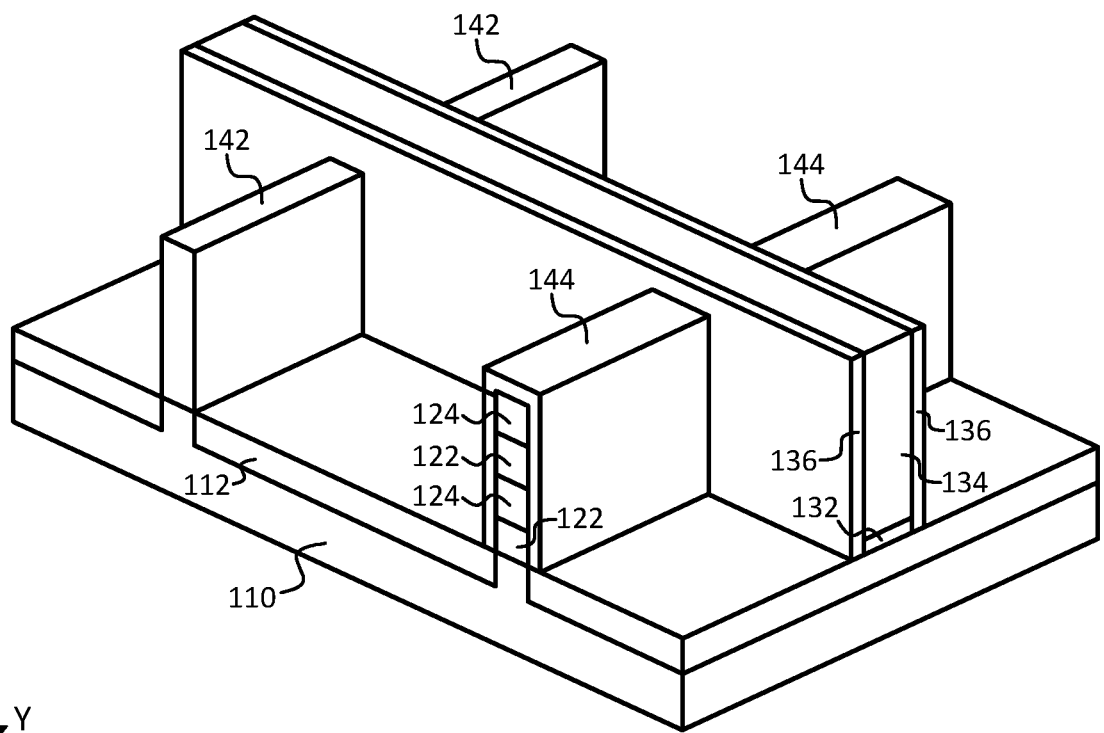

FIG. 1D illustrates an example resulting IC structure after source/drain (S/D) processing has been performed on the structure of FIG. 1C, in accordance with an embodiment. In the example structure of FIG. 1D, different S/D regions have been formed to illustrate different S/D approaches that may be utilized. For instance, for the left-most fin stack 121, the material in the S/D regions was removed and replaced with replacement material 142, as shown. Note that the rectangular block shape of S/D regions 142 are used for ease of illustration; however, such regrown S/D regions may include other shapes and sizes, as can be understood based on this disclosure. The replacement S/D regions may be formed using any suitable techniques, such as removing at least a portion (or all) of the fin stack 121 and depositing/growing the replacement S/D regions 142. In some embodiments, STI material may be present, such that the replacement S/D material 142 may only grow from the exposed portion of substrate 110 or the remaining bottom portion of fin stack 121, for example. For the right-most fin stack 121, S/D material 144 was formed over the fin stack in the S/D regions, as shown. Such an overlying S/D feature 144 may be considered a cladding layer, for example. Thus, in such example S/D regions including layer 144, all or a portion of fin stack 121 may remain in the S/D regions, as can be understood based on this disclosure.

Regardless of the S/D scheme employed, the S/D regions may include any suitable material, such as group IV semiconductor material, for example. For instance, both features 142 and 144 may include Si, SiGe, and/or Ge, in accordance with some embodiments. Further, the S/D regions may include any suitable doping scheme, such that one or both of the S/D regions in a given S/D set may include suitable n-type and/or p-type impurity dopants, depending on the desired configuration. For instance, in the case of fabricating an n-MOS device, both of the S/D regions in a given set (e.g., both of 142 or 144) may include suitable n-type dopants, and in the case of fabricating a p-MOS device, both of the S/D regions in a given set may include suitable p-type dopants, in accordance with some embodiments. Recall that in TFET devices, the S/D regions in a given set are generally oppositely type doped, such that one of the S/D regions is n-type doped and the other is p-type doped. In some embodiments, one or both of the S/D regions in a given set may include a multilayer structure of two or more material layers, for example. In some embodiments, one or both of the S/D regions in a given set may include grading (e.g., increasing and/or decreasing) the content/concentration of one or more materials in at least a portion of the region(s). In some embodiments, additional layers may be included in the S/D regions, such as a cap layer used to reduce resistance reduction between the S/D regions and the S/D contacts, for example. Such a cap/resistance reducing layer may include different material than the main S/D material and/or include higher concentration of doping relative to the main S/D material, in accordance with some such embodiments. Note that in some embodiments, S/D processing may be performed after the final gate stack processing has been performed, such as after the processing performed to form the example structure of FIG. 1H, for example.

Figure 1E:
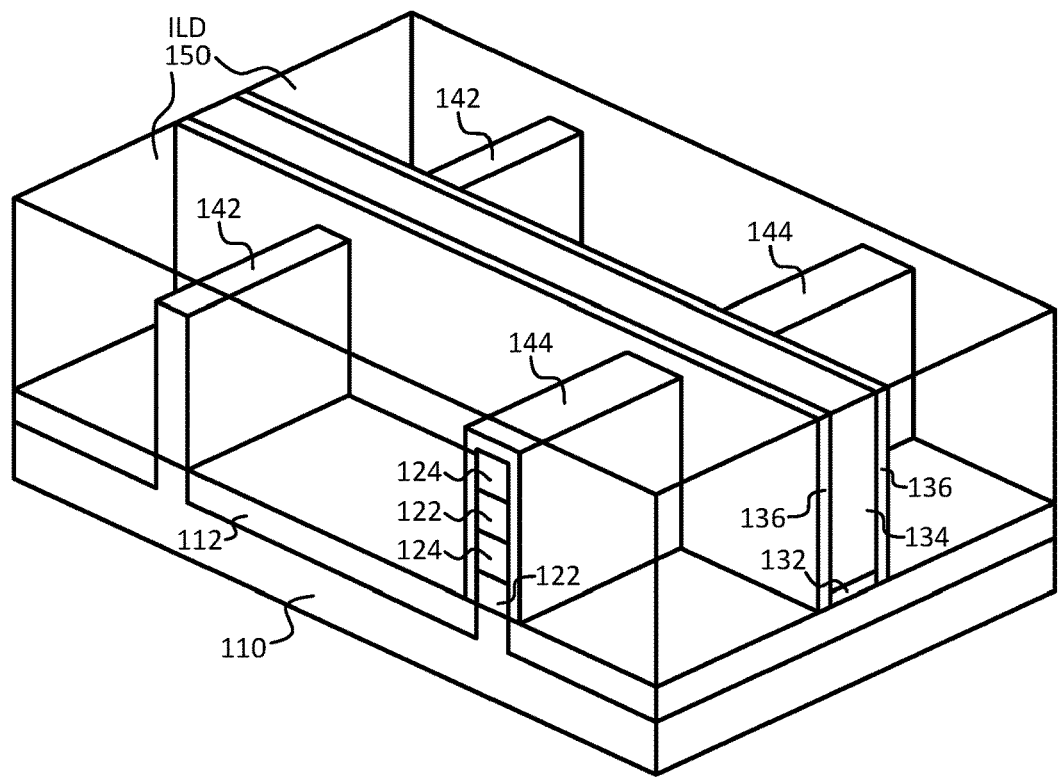

FIG. 1E illustrates an example resulting IC structure formed after a layer of interlayer dielectric (ILD) 150 material has been formed on the structure of FIG. 1D, in accordance with an embodiment. In some embodiments, ILD layer 150 may be formed using any suitable techniques, such as depositing the ILD material and optionally performing a polish/planarization process to form the example structure of FIG. 1E. Note that, in this example embodiment, ILD layer 150 is illustrated as transparent to allow for underlying features to be seen. In some embodiments, the ILD layer 150 may include a dielectric material, such as silicon dioxide or silicon nitride, or some other suitable electrically insulating material, for example.

Figure 1F:
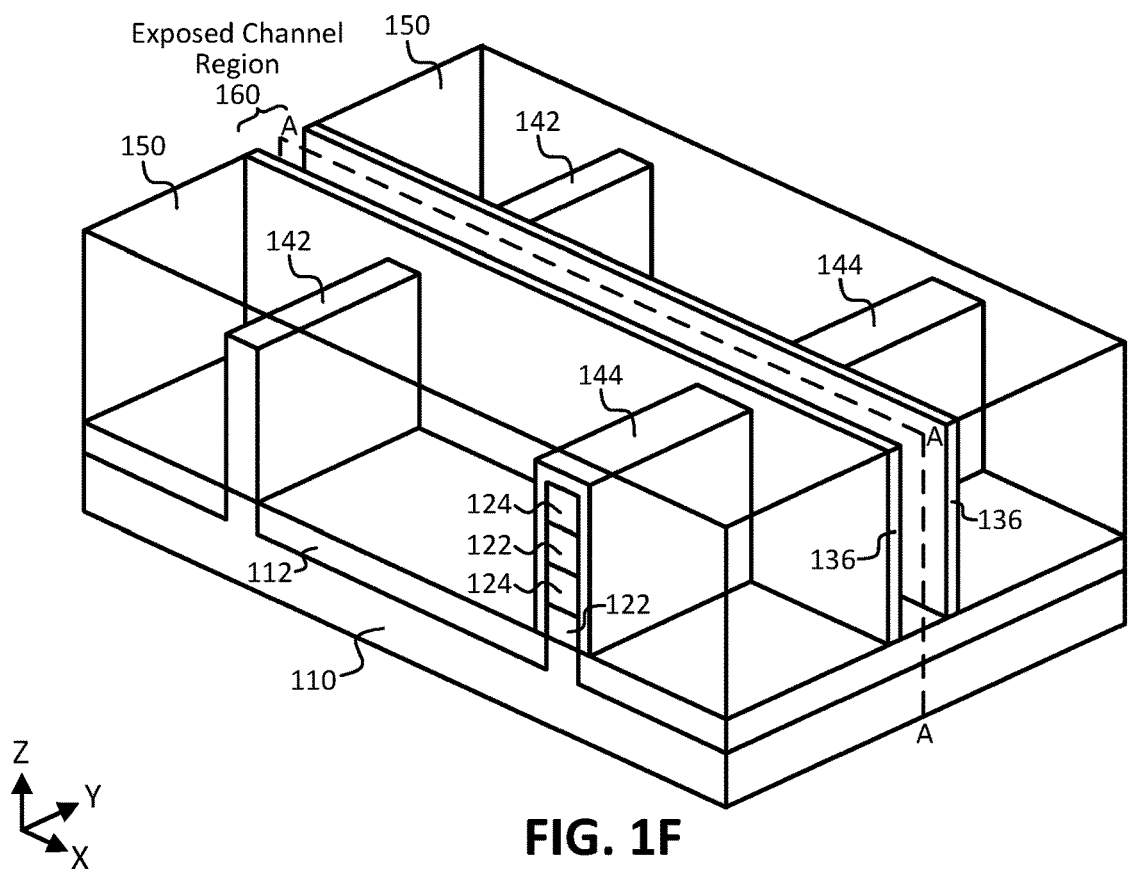

FIG. 1F illustrates an example resulting IC structure formed after the dummy gate stack (including dummy gate dielectric layer 132 and dummy gate 134) of FIG. 1E has been removed to expose the channel region, in accordance with an embodiment. Note that the exposed channel region is indicated as 160 in the figures. In some embodiments, removing the dummy gate stack may include first removing a hardmask layer that is formed on the dummy gate stack (when such a hardmask layer is present), and then removing the dummy gate stack layers 134 and 132 (dummy gate 134 and dummy gate electrode 132, in this example case) using any suitable techniques, such as etches, polishes, and/or cleaning processes, for example. The A plane in FIG. 1F is used to indicate the cross-sectional views of FIGS. 1G-J, as will be described in more detail below.

Figure 1G:
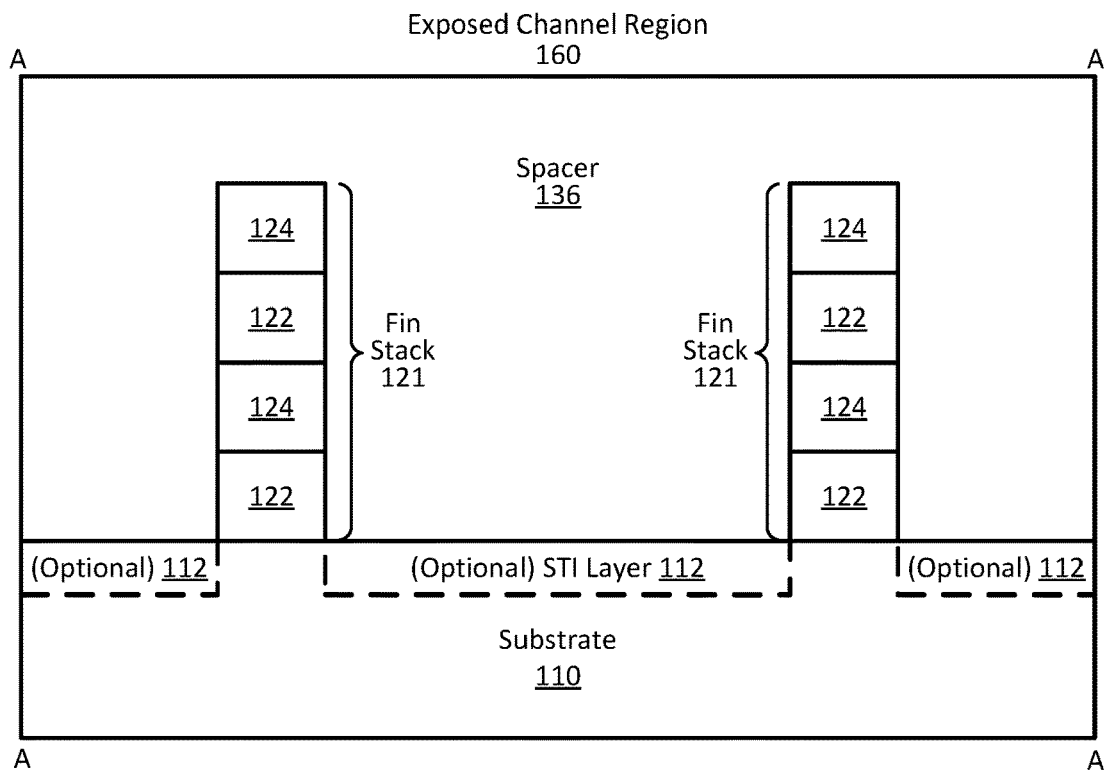

FIGS. 1G-J illustrate cross-sectional views taken along plane A of FIG. 1F, showing example IC structures formed during channel region and gate stack processing, in accordance with some embodiments. As shown in FIG. 1G, the structure includes the same IC structure as that of FIG. 1F, except that a different view is used to assist in illustrating processing that occurs continuing from the structure of FIG. 1H. Therefore, as shown in FIG. 1G, the structure includes the two fin stacks 121 that were previously formed above and on substrate 110, with spacer 136 behind the fin stacks 121. To assist with the orientation between the structure of FIGS. 1F and 1G, one can refer to the X, Y, and Z-axes that are included for each view. Recall that in some embodiments, STI material may be present between and on the outside of the fin stacks 121 of FIG. 1G, which may help protect substrate 110. For instance, the optional STI layer 112 is shown in FIGS. 1G-1J in dashed lines to illustrate where such an STI layer 112 may be located, when present.

Figure 1H:
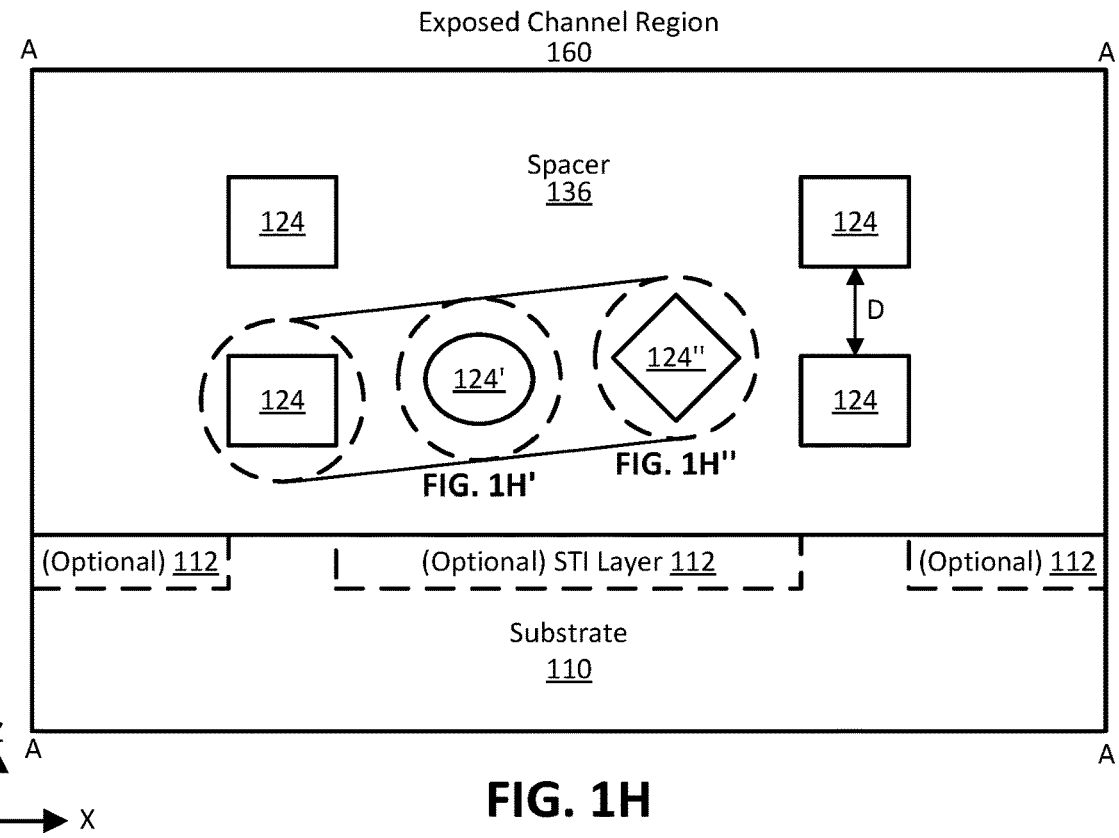

FIG. 1H illustrates an example resulting IC structure after selective etch processing has been performed on the structure of FIG. 1G to remove sacrificial layers 122, in accordance with an embodiment. In some embodiments, the selective etch processing may include one or more selective etches that remove the material of sacrificial layers 122 at a rate of at least 1.5, 2, 3, 4, 5, 10, 50, 100, or 1000 times faster relative to the removal of the material of non-sacrificial layers 124 for a given etchant. In some embodiments, the selective etch processing may not remove any material (or remove a negligible amount of material) from the non-sacrificial layers 124, for example. As can be understood based on this disclosure, the particular etchant used in the selective etch process may be selected based on the material included in sacrificial layers 122 and non-sacrificial layers 124, for example. For instance, a peroxide chemistry may be used to selectively etch and remove the material of sacrificial layers 122 while minimally removing material from (or not removing material at all from) non-sacrificial layers 124. In embodiments where carbon alloy is included in the non-sacrificial layers 124, it may help those layers be more resistant to the selective etch processing, such that relatively less material is removed from the non-sacrificial layers 124 than if those layers 124 did not include carbon alloy, for example. In embodiments where carbon alloy is included in the sacrificial layers 122, it may increase the quantity and/or quality of etchants available for the selective etch processing used to remove those sacrificial layers 122, for example. Therefore, numerous benefits can be realized using the techniques variously described herein.

As can be understood based on FIGS. 1G-1H, the non-sacrificial layers 124 of FIG. 1G became the nanowires 124 of FIG. 1H after sacrificial layers 122 were removed via selective etch processing (only in the exposed channel region 160, as the remainder of the structure of FIG. 1F is covered with ILD layer 150). Thus, when non-sacrificial layers 124 are included in a multilayer fin stack 121, they are referred to as such herein, but once the non-sacrificial layers 124 are converted into nanowires via removal of overlying/underlying sacrificial layers 124, they will be referred to as nanowires 124. Recall that any number of nanowires/nanoribbons may be formed in the channel region of a GAA transistor, in accordance with some embodiments. Therefore, although only two nanowires 124 are formed in the exposed channel region 160 in the example structure of FIG. 1H, the selective etch processing may be used to form 1-10, or more nanowires, for example. In some embodiments, the selective etch processing may not completely remove the sacrificial portion of the multilayer fin stack 121, such that at least a portion of one or more sacrificial layers 122 may still be present in the end structure, for example. Therefore, in some such embodiments, the selective etch processing may be considered to at least partially remove the sacrificial portion of the multilayer fin stack 121, for example. Also note that although the nanowires 124 are depicted as generally having a rectangular shape in the cross-sectional view of FIG. 1H, the present disclosure is not intended to be so limited. For example, in some embodiments, included nanowires may have different cross-sectional geometries, which may more-so resemble a circle, semi-circle, ellipse, semi-ellipse, oval, semi-oval, square, parallelogram, rhombus, trapezoid, diamond, triangle, pentagon, hexagon, and so forth, regardless of orientation. Further, two nanowires included in the same transistor channel region need not have similar cross-sectional geometry, in some embodiments. For instance, the blown out views of FIGS. 2H' and 2H'' illustrate cross-sectional geometries that generally have an elliptical (nanowire 124') and diamond shape (nanowire 124''), respectively.

In some embodiments, the nanowires 124 formed via the selective etch processing in the channel region 160 may retain their original thickness (dimension in the Z-axis direction). However, in other embodiments, some material may be removed from features 124 during the selective etch processing. Therefore, in some embodiments, the resulting nanowires 124 may include a maximum thickness (dimension in the Z-axis or vertical direction) in the range of 1-100 nm (e.g., 2-10 nm), or any other suitable maximum thickness as will be apparent in light of this disclosure. Further, in some embodiments, the nanowires within the channel region of a transistor (e.g., the set of nanowires 124 on the left side or the set on the right side, or both) may include nanowires of varying maximum thicknesses, such that two nanowires may have different relative thicknesses (e.g., relative maximum thickness difference of at least 1, 2, 3, 4, 5, or 10 nm). However, in other embodiments, the nanowires within the channel region of a transistor may include nanowires of similar maximum thicknesses, such that each nanowire is within 1, 2, or 3 nm of the average maximum thickness of all of the nanowires in the channel region, or within some other suitable amount as will be apparent in light of this disclosure. The space/distance between nanowires included in a transistor channel region may also vary, in accordance with some embodiments. In some embodiments, the minimum distance between two nanowires in a channel region (e.g., the dimension indicated as distance D in FIG. 1H) may be in the range of 1-50 nm (e.g., 2-10 nm) or some other suitable amount as will be apparent in light of this disclosure. In some embodiments, the minimum distance between two nanowires may be less than a quantity in the range of 2-10 nm, or less than some other suitable maximum threshold amount as will be apparent in light of this disclosure. In some embodiments, the minimum distance (e.g., distance D) that can be achieved between two nanowires formed using the techniques herein employing carbon as variously described may be relatively less compared to techniques of forming similar nanowires without employing carbon. Therefore, as a result of being able to achieve smaller minimum distances (e.g., due to the lack of or reduced diffusion between sacrificial and non-sacrificial layers), more nanowires can be formed in a given channel region height, thereby leading to an improvement in transistor performance, as described herein.

Figure 1I:
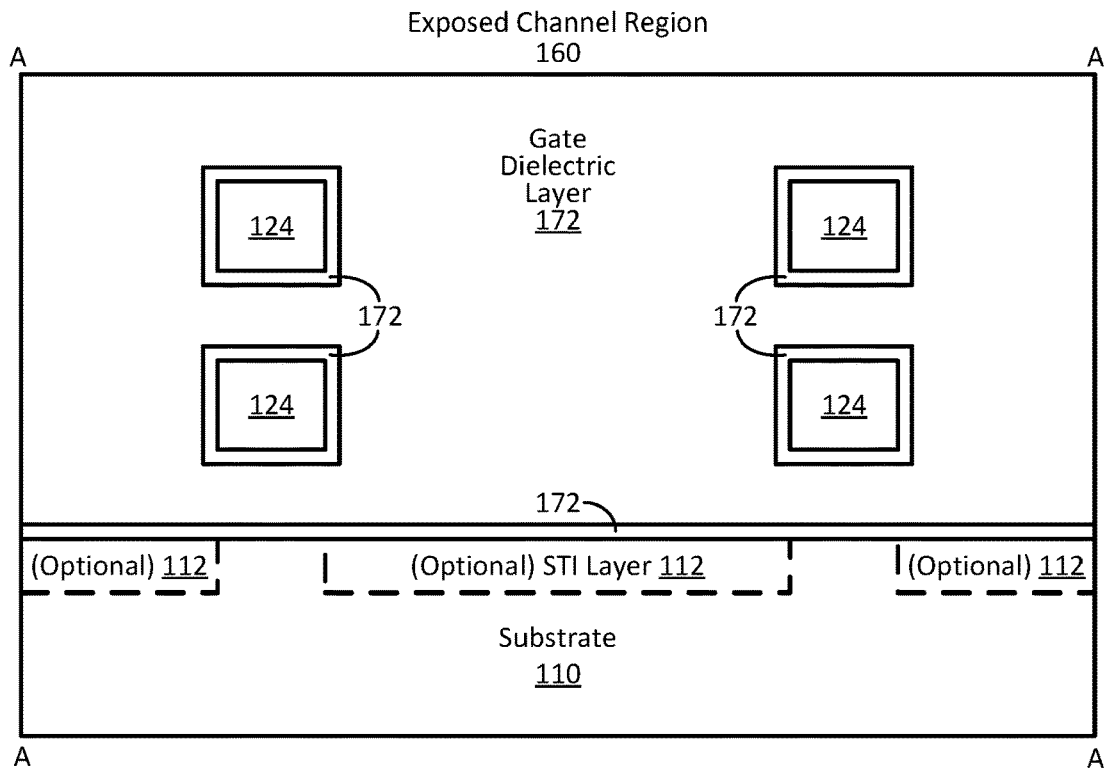

FIG. 1I illustrates an example resulting IC structure after gate dielectric layer 172 has been deposited in the exposed channel region 160 of the structure of FIG. 1H, in accordance with an embodiment. In some embodiments, gate dielectric layer 172 may be formed using any suitable techniques, such as using any suitable deposition process (e.g., MBE, CVD, ALD, PVD), for example. In some embodiments, gate dielectric layer 172 may include silicon dioxide and/or a high-k dielectric material, depending on the end use or target application. Examples of high-k gate dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer 172 to improve its quality when a high-k material is used, for example. In some embodiments, gate dielectric layer 172 may be relatively thin, such as having a thickness in the range of 1-20 nm, for example, or some other suitable thickness as will be apparent in light of this disclosure. Note that gate dielectric layer 172 was formed on the bottom of the exposed channel region from the structure of FIG. 1H and also on the exposed sidewalls of spacers 136, as can be understood based on the structure of FIG. 1I.

Figure 1J:
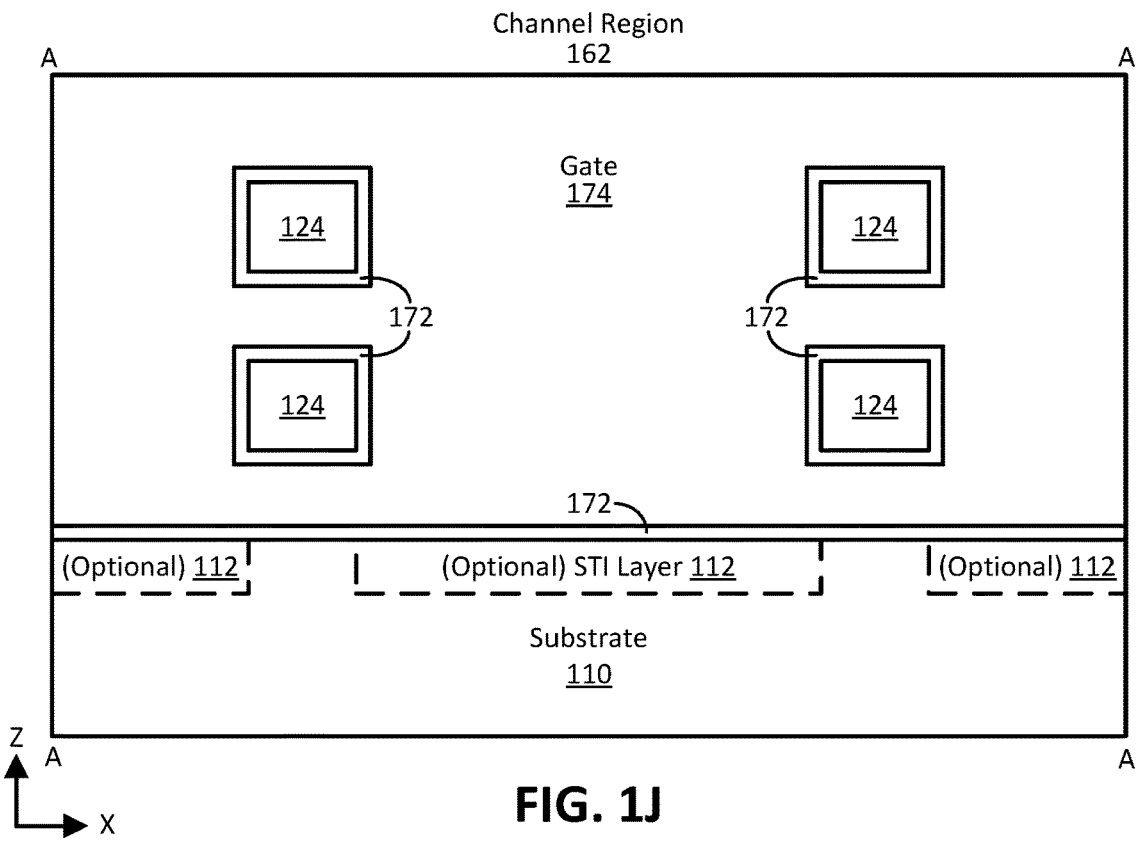

FIG. 1J illustrates an example resulting IC structure after gate (or gate electrode) 174 has been deposited in the exposed channel region 160 of the structure of FIG. 1I, in accordance with an embodiment. In some embodiments, gate 174 may be formed using any suitable techniques, such as using any suitable deposition process (e.g., MBE, CVD, ALD, PVD), for example. In some embodiments, gate (or gate electrode) 174 may include a wide range of materials, such as polysilicon, silicon nitride, silicon carbide, or various suitable metals or metal alloys, such as aluminum (Al), tungsten (W), titanium (Ti), tantalum (Ta), copper (Cu), titanium nitride (TiN), or tantalum nitride (TaN), for example. In some embodiments, gate 174 may have a thickness in the range of 10-200 nm, for example, or some other suitable thickness as will be apparent in light of this disclosure. In some embodiments, gate dielectric layer 172 and/or gate 174 may include a multilayer structure of two or more material layers, for example. In some embodiments, gate dielectric layer 172 and/or gate 174 may include grading (e.g., increasing and/or decreasing) the content/concentration of one or more materials in at least a portion of the feature(s). Additional layers may be present in the final gate stack (e.g., in addition to gate dielectric layer 172 and gate 174), in some embodiments, such as one or more work function layers or other suitable layers, for example. As shown in the example embodiment of FIG. 1J, gate 174 (and the entire gate stack, in general) wraps completely or 100 percent around each nanowire 124. However, in some embodiments, the gate 174 may substantially wrap around each nanowire, such that it wraps around at least 60, 65, 70, 75, 80, 85, 90, 95, or 98 percent of each nanowire, for example, or some other suitable amount as will be apparent in light of this disclosure. As can also be understood based on this disclosure, in some embodiments, gate dielectric layer 174 may wrap around more of one or more nanowires in the channel region compared to gate 172, due to, for example, gate dielectric layer 172 occupying the space between nanowires and/or preventing gate 174 from forming in the space between nanowires, particularly when that space (having a minimum dimension D, shown in FIG. 1H) is relatively small (e.g., less than 5 nm). Note that after gate stack processing has been performed and gate 174 has been formed, the exposed channel region 160 is no longer exposed and has become channel region 162 in FIG. 1J.

Figure 1K:
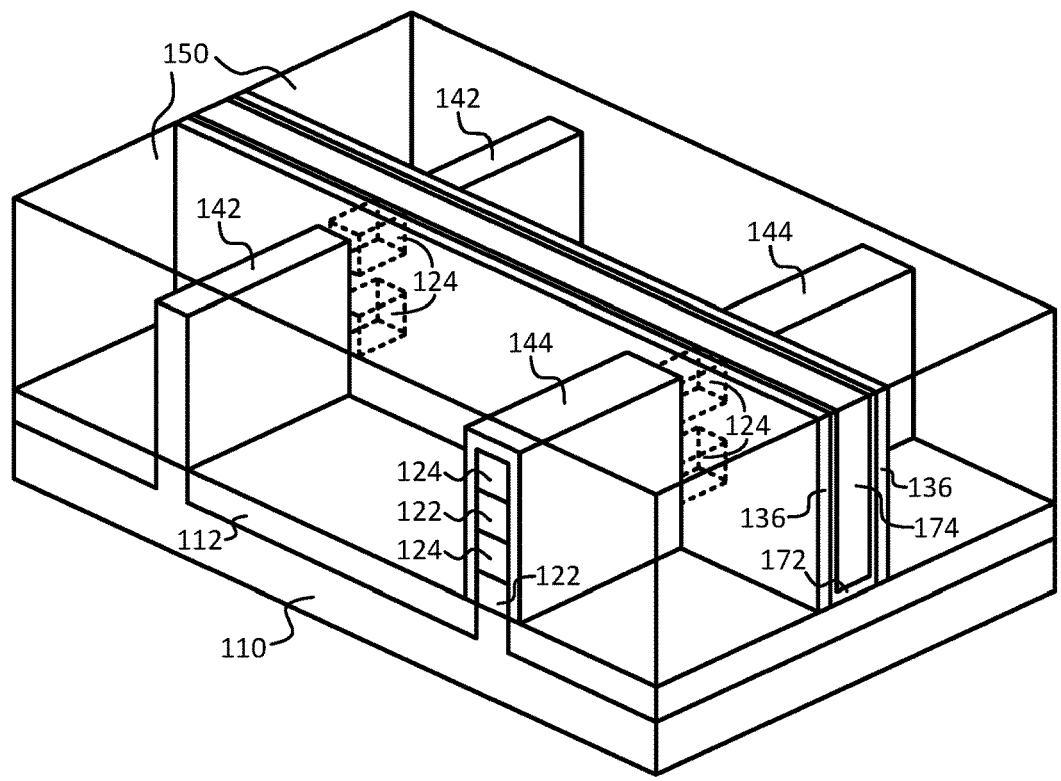

FIG. 1K illustrates a resulting example IC structure after the processing of FIGS. 1G-1J has been performed on the structure of FIG. 1F, in accordance with an embodiment. In other words, the structure of FIG. 1K is the same as the structure of FIG. 1J except that the view reverts back to the perspective view of the IC structure to illustrate subsequent processing, for example. Recall that the X, Y, and Z-axes are provided for all IC views to assist with orientation of the various figures. Also recall that in some embodiments, S/D processing may not occur until after the gate stack processing, such that S/D processing could be performed using the structure of FIG. 1K (if it had not yet been performed), for example.

Figure 1L:
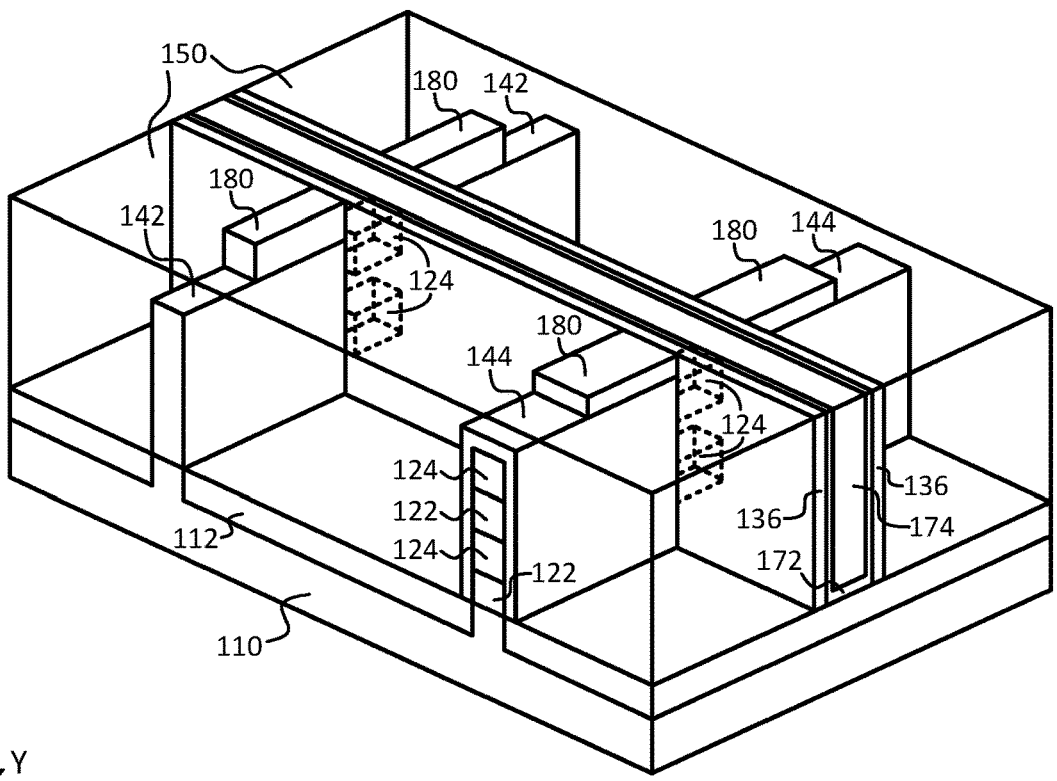

FIG. 1L illustrates a resulting example IC structure after forming S/D contacts 180 for the structure of FIG. 1K, in accordance with an embodiment. In some embodiments, S/D contacts 180 may be formed using any suitable techniques, such as forming contact trenches in the ILD layer 150 over the respective S/D regions and depositing metal or metal alloy (or other suitable electrically conductive material) in the trenches. In some embodiments, S/D contact 180 formation may include silicidation, germinidation, and/or annealing processes, for example. In some embodiments, S/D contacts 180 may include aluminum or tungsten, although any suitable conductive metal or alloy can be used, such as silver, nickel-platinum, or nickel-aluminum, for example. In some embodiments, one or more of the S/D contacts 180 may include a resistance reducing metal and a contact plug metal, or just a contact plug, for instance. Example contact resistance reducing metals include, for instance, nickel, aluminum, titanium, gold, gold-germanium, nickel-platinum, or nickel aluminum, and/or other such resistance reducing metals or alloys. Example contact plug metals include, for instance, aluminum, copper, nickel, platinum, titanium, or tungsten, or alloys thereof, although any suitably conductive contact metal or alloy may be used. In some embodiments, additional layers may be present in the S/D contact regions, such as adhesion layers (e.g., titanium nitride) and/or liner or barrier layers (e.g., tantalum nitride), if so desired.

Additional processing to complete the IC after S/D contact processing may include back-end or back-end-of-line (BEOL) processing to form one or more metallization layers and/or to interconnect the transistor devices formed, for example. Any other suitable processing may be performed, as will be apparent in light of this disclosure. Note that the techniques and resulting IC structures formed therefrom are presented in a particular order for ease of description. However, one or more of the processes may be performed in a different order or may not be performed at all. Recall that the techniques may be used to form one or more transistor devices including any of the following: field-effect transistors (FETs), metal-oxide-semiconductor FETs (MOSFETs), tunnel-FETs (TFETs), and/or nanowire (or nanoribbon or gate-all-around (GAA)) configuration transistors (having any number of nanowires/nanoribbons). In addition, the devices formed may include p-type transistor devices (e.g., p-MOS) and/or n-type transistor devices (e.g., n-MOS). Further, the transistor-based devices may include complementary MOS (CMOS) devices or quantum devices (few to single electron), to name a few examples. Numerous variations and configurations will be apparent in light of this disclosure.

Figure 2:
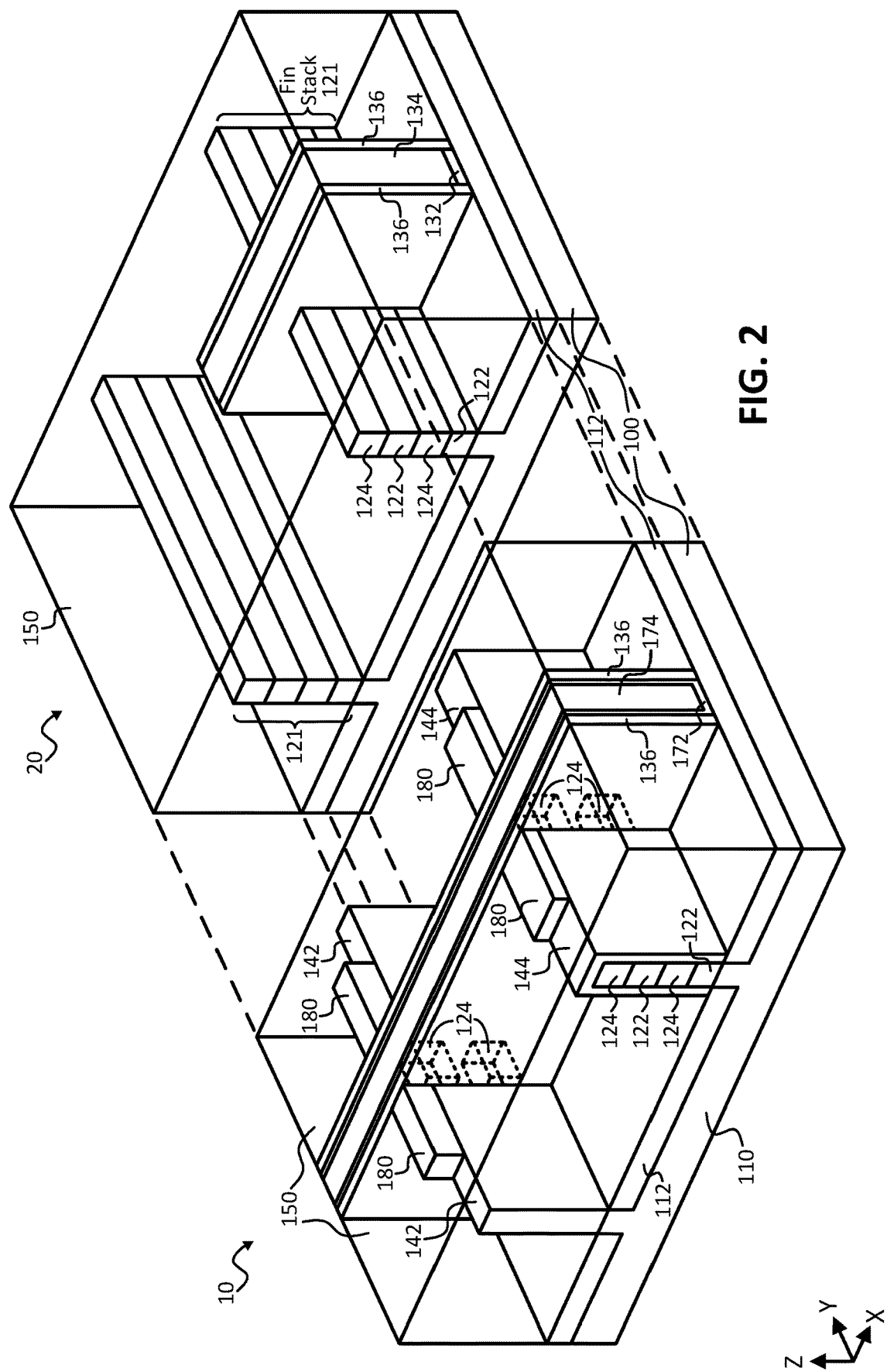
FIG. 2 illustrates the IC structure of FIG. 1L on the same die as a structure including a multilayer fin stack, in accordance with some embodiments of the present disclosure.

FIG. 2 illustrates the IC structure of FIG. 1L (indicated as structure 10) on the same die as a structure including fin stack 121 (indicated as structure 20), in accordance with some embodiments of the present disclosure. FIG. 2 is provided to illustrate that the techniques and structures described herein may be detected even when the sacrificial portion of the multilayer stack used to form one or more nanowires (e.g., sacrificial layers 122) was the only portion of the multilayer stack that included carbon, in accordance with some embodiments. In some such embodiments, the multilayer fin stack including carbon-based layers may still be present in the S/D regions of the resulting transistor (such as is the case for the right S/D regions under S/D layer 144, for example). However, in embodiments where the S/D regions are formed by removing the multilayer fin stack, the carbon-based layers may not be present in the final transistor structure. Therefore, detection of the techniques may be achieved based on structures remaining after various stages of the fabrication process, which may be considered artifacts of the full method described with reference to FIGS. 1A-L, for example. For instance, IC structure 10 (which is the same structure shown in FIG. 1L and described herein) may share the same substrate 110 (or underlying die or wafer) with one or more dummy or unused structures, such as those illustrated in the example IC structure 20. As shown in the example IC structure 20, the left fin may have been processed to the stage of the structure shown in FIG. 1B, such that the same substrate 110 (or underlying die or wafer) includes an artifact multilayer fin stack 121 along with a nanowire transistor as variously described herein. To provide another example, the right fin in example IC structure 20 was processed to the stage of the structure shown in FIG. 1C, as can be understood based on this disclosure. Regardless, both of the artifacts include a multilayer fin stack 121 as variously described herein. Numerous ways of detecting the techniques and structures described herein will be apparent in light of this disclosure.

Example System

Figure 3:
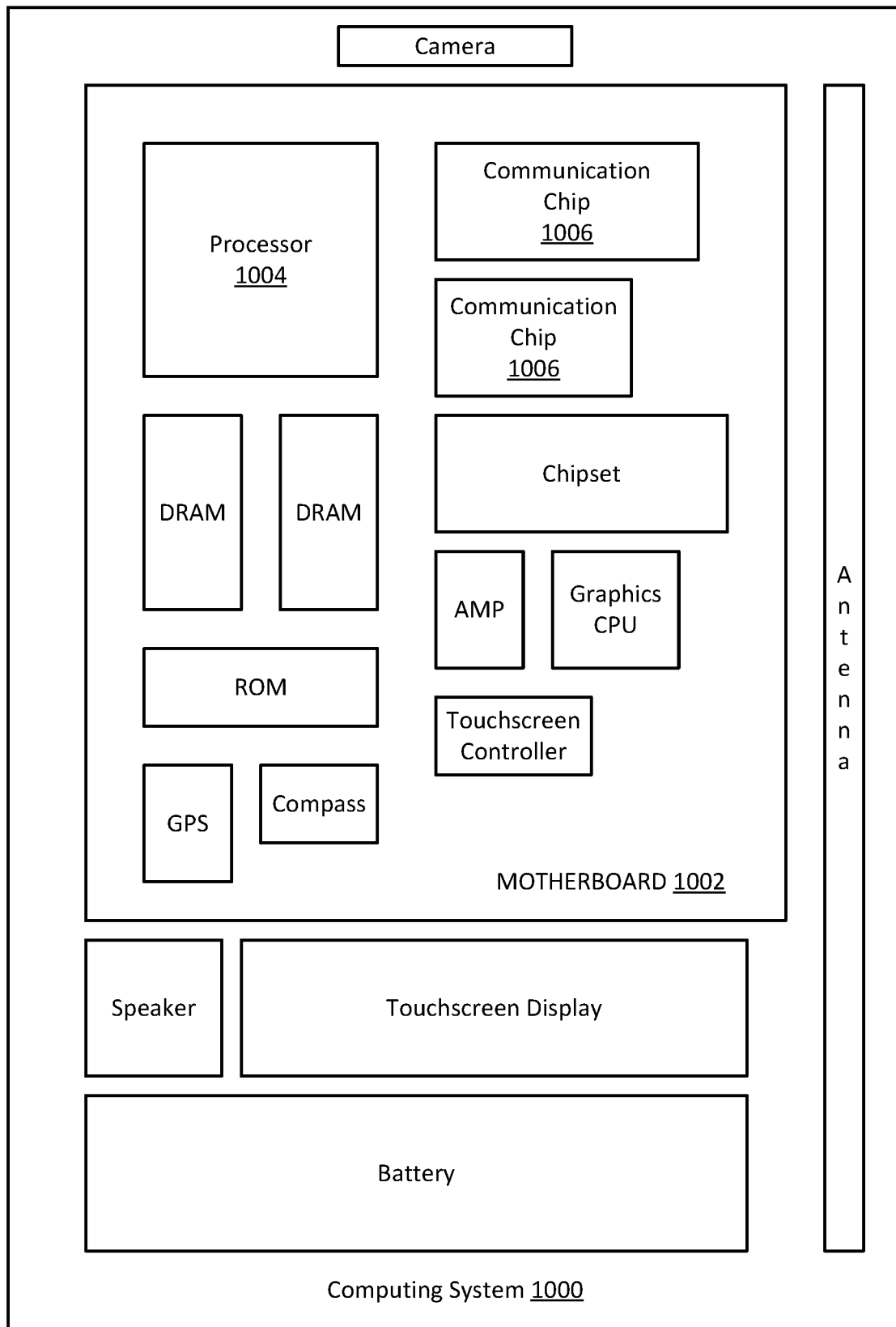
FIG. 3 illustrates a computing system implemented with integrated circuit structures and/or transistor devices formed using the techniques disclosed herein, in accordance with some embodiments of the present disclosure.

FIG. 3 illustrates a computing system 1000 implemented with integrated circuit structures and/or transistor devices formed using the techniques disclosed herein, in accordance with some embodiments of the present disclosure. As can be seen, the computing system 1000 houses a motherboard 1002. The motherboard 1002 may include a number of components, including, but not limited to, a processor 1004 and at least one communication chip 1006, each of which can be physically and electrically coupled to the motherboard 1002, or otherwise integrated therein. As will be appreciated, the motherboard 1002 may be, for example, any printed circuit board, whether a main board, a daughterboard mounted on a main board, or the only board of system 1000, etc.

Depending on its applications, computing system 1000 may include one or more other components that may or may not be physically and electrically coupled to the motherboard 1002. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1000 may include one or more integrated circuit structures or devices formed using the disclosed techniques in accordance with an example embodiment. In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing system 1000 includes an integrated circuit die packaged within the processor 1004. In some embodiments, the integrated circuit die of the processor includes onboard circuitry that is implemented with one or more integrated circuit structures or devices formed using the disclosed techniques, as variously described herein. The term "processor" may refer to any device or portion of a device that processes, for instance, electronic data from registers and/or memory to transform that electronic data into other electronic data that may be stored in registers and/or memory.

The communication chip 1006 also may include an integrated circuit die packaged within the communication chip 1006. In accordance with some such example embodiments, the integrated circuit die of the communication chip includes one or more integrated circuit structures or devices formed using the disclosed techniques as variously described herein. As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein.

In various implementations, the computing system 1000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device or system that processes data or employs one or more integrated circuit structures or devices formed using the disclosed techniques, as variously described herein. Note that reference to a computing system is intended to include computing devices, apparatuses, and other structures configured for computing or processing information.

Further Example Embodiments

The following examples pertain to further embodiments, from which numerous permutations and configurations will be apparent.

Example 1 is an integrated circuit (IC) including: a substrate; and a transistor including a channel region above the substrate, the channel region including a nanowire, wherein the nanowire includes group IV semiconductor material having an alloy of carbon (C), such that carbon constitutes only a portion of the nanowire material, and a gate substantially around the nanowire.

Example 2 includes the subject matter of Example 1, wherein the group IV semiconductor material is silicon (Si).

Example 3 includes the subject matter of Example 1 or 2, wherein the group IV semiconductor material is germanium (Ge).

Example 4 includes the subject matter of any of Examples 1-3, wherein the group IV semiconductor material is silicon germanium (SiGe).

Example 5 includes the subject matter of any of Examples 1-4, wherein carbon constitutes less than 5 percent of the nanowire material.

Example 6 includes the subject matter of any of Examples 1-5, wherein carbon constitutes less than 2 percent of the nanowire material.

Example 7 includes the subject matter of any of Examples 1-6, wherein the nanowire has a maximum thickness in a vertical direction of less than 10 nanometers (nm).

Example 8 includes the subject matter of any of Examples 1-7, wherein the channel region includes multiple nanowires.

Example 9 includes the subject matter of Example 8, wherein two nanowires in the channel region are separated by a maximum of 5 nanometers (nm).

Example 10 includes the subject matter of Example 8 or 9, wherein two nanowires in the channel region are separated by a maximum of 2 nanometers (nm).

Example 11 includes the subject matter of any of Examples 1-10, wherein substantially around the nanowire includes that the gate is around at least 80 percent of the nanowire.

Example 12 includes the subject matter of any of Examples 1-11, further including a gate dielectric layer between the gate and the nanowire.

Example 13 includes the subject matter of any of Examples 1-12, wherein the transistor is one of a p-channel and n-channel device.

Example 14 includes the subject matter of any of Examples 1-13, wherein the transistor is one of a metal-oxide-semiconductor field-effect transistor (MOSFET) and a tunnel field-effect transistor (TFET).

Example 15 is a computing system including the subject matter of any of Examples 1-14.

Example 16 is an integrated circuit including: a substrate; a transistor including a channel region above the substrate, the channel region including a nanowire, wherein the nanowire includes group IV semiconductor material, and a gate substantially around the nanowire; and a multilayer fin-shaped stack above the substrate, the multilayer fin-shaped stack including a first layer and a second layer, the second layer between the first layer and the substrate, the first layer including the nanowire and the second layer including group IV semiconductor material having an alloy of carbon (C), such that carbon constitutes less than 5 percent of the second layer material.

Example 17 includes the subject matter of Example 16, wherein the group IV semiconductor material included in the second layer includes at least one of silicon (Si) and germanium (Ge).

Example 18 includes the subject matter of Example 16 or 17, wherein the group IV semiconductor material included in the nanowire and the first layer is silicon (Si).

Example 19 includes the subject matter of Example 16 or 17, wherein the group IV semiconductor material included in the nanowire and the first layer is germanium (Ge).

Example 20 includes the subject matter of Example 16 or 17, wherein the group IV semiconductor material included in the nanowire and the first layer is silicon germanium (SiGe).

Example 21 includes the subject matter of any of Examples 16-20, wherein carbon constitutes less than 2 percent of the second layer material.

Example 22 includes the subject matter of any of Examples 16-21, wherein the nanowire has a maximum thickness in a vertical direction of less than 5 nanometers (nm).

Example 23 includes the subject matter of any of Examples 16-22, wherein the channel region includes multiple nanowires.

Example 24 includes the subject matter of Example 23, wherein the channel region includes at least 10 nanowires.

Example 25 includes the subject matter of Example 23 or 24, wherein two nanowires in the channel region are separated by a maximum of 3 nanometers (nm).

Example 26 includes the subject matter of any of Examples 16-25, wherein substantially around the nanowire includes that the gate is around at least 90 percent of the nanowire.

Example 27 includes the subject matter of any of Examples 16-26, further including a gate dielectric layer between the gate and the nanowire.

Example 28 includes the subject matter of any of Examples 16-27, wherein the transistor is one of a p-channel and n-channel device.

Example 29 includes the subject matter of any of Examples 16-28, wherein the transistor is one of a metal-oxide-semiconductor field-effect transistor (MOSFET) and a tunnel field-effect transistor (TFET).

Example 30 is a computing system including the subject matter of any of Examples 16-29.

Example 31 is a method of forming an integrated circuit (IC), the method including: forming a multilayer fin-shaped stack in a channel region of a transistor, the multilayer fin-shaped stack including a first layer and a second layer below the first layer, the first and second layers each including group IV semiconductor material, wherein at least one of the first and second layers include an alloy of carbon (C), such that carbon constitutes only a portion of at least one of the first and second layer material; and performing selective etch processing to at least partially remove the second layer.

Example 32 includes the subject matter of Example 31, wherein the selective etch processing includes using a given etchant that removes the second layer material at a rate of at least 2 times faster than a rate at which the given etchant removes the first layer material.

Example 33 includes the subject matter of Example 31 or 32, wherein the selective etch processing includes using a given etchant that removes the second layer material at a rate of at least 10 times faster than a rate at which the given etchant removes the first layer material.

Example 34 includes the subject matter of any of Examples 31-33, wherein the first layer includes an alloy of carbon (C), such that carbon constitutes less than 5 percent of the first layer material.

Example 35 includes the subject matter of any of Examples 31-34, wherein the second layer includes an alloy of carbon (C), such that carbon constitutes less than 5 percent of the second layer material.

Example 36 includes the subject matter of any of Examples 31-35, wherein at least one of the first and second layers includes silicon (Si).

Example 37 includes the subject matter of any of Examples 31-36, wherein at least one of the first and second layers includes germanium (Ge).

Example 38 includes the subject matter of any of Examples 31-37, wherein at least one of the first and second layers includes silicon germanium (SiGe).

Example 39 includes the subject matter of any of Examples 31-38, further including forming a gate substantially around the first layer, wherein substantially around the first layer means that the gate is around at least 80 percent of the first layer.

Example 40 includes the subject matter of any of Examples 31-39, wherein at least one of the first and second layers has a maximum thickness in a vertical direction of less than 5 nm.

Example 41 includes the subject matter of any of Examples 31-40, wherein at least one of the first and second layers has a maximum thickness in a vertical direction of less than 2 nm.

Example 42 includes the subject matter of any of Examples 31-41, wherein the multilayer fin-shaped stack includes at least two alternating first and second layer sets.

Example 43 includes the subject matter of any of Examples 31-42, wherein forming the multilayer fin-shaped stack includes an aspect ratio trapping (ART) based process.

The foregoing description of example embodiments has been presented for the purposes of illustration and description. It is not intended to be exhaustive or to limit the present disclosure to the precise forms disclosed. Many modifications and variations are possible in light of this disclosure. It is intended that the scope of the present disclosure be limited not by this detailed description, but rather by the claims appended hereto. Future filed applications claiming priority to this application may claim the disclosed subject matter in a different manner, and may generally include any set of one or more limitations as variously disclosed or otherwise demonstrated herein.

What is claimed is:

1. An integrated circuit (IC) comprising:
    a transistor including
    a nanowire above a fin, wherein the nanowire includes a semiconductor material comprising an alloy of carbon and a group IV semiconductor, such that carbon constitutes less than 5 percent of total atomic percentage of the nanowire;
    a gate structure wrapped around the nanowire, the gate structure including a gate dielectric and a gate electrode; and
    a first source or drain structure at a first end of the nanowire and a second source or drain structure at a second end of the nanowire, wherein the first and second source or drain structures comprise a semiconductor material different than the semiconductor material of the nanowire, and wherein the semiconductor material of the first and second source or drain structures is on the fin.

2. The IC of claim 1, wherein the group IV semiconductor includes silicon (Si), such that the nanowire consists essentially of silicon and carbon, not accounting for any impurity dopant.

3. The IC of claim 1, wherein the group IV semiconductor includes germanium (Ge), such that the nanowire consists essentially of germanium and carbon, not accounting for any impurity dopant.

4. The IC of claim 1, wherein the group IV semiconductor includes silicon (Si) and germanium (Ge), such that the nanowire consists essentially of silicon, germanium and carbon, not accounting for any impurity dopant.

5. The IC of claim 1, wherein carbon constitutes less than 2 percent of total atomic percentage of the nanowire.

6. The IC of claim 1, wherein the nanowire has a maximum thickness in a vertical direction of less than 10 nanometers (nm).

7. The IC of claim 1, wherein the nanowire is one of multiple nanowires, and the gate dielectric is wrapped around each nanowire.

8. The IC of claim 7, wherein two of the nanowires are separated by a maximum of 5 nanometers (nm), and at least a portion of the gate electrode is between the two nanowires.

9. The IC of claim 7, wherein two of the nanowires are separated by a maximum of 2 nanometers (nm).

10. The IC of claim 1, wherein the gate electrode is around at least 80 percent of the nanowire.

11. The IC of claim 1, wherein the gate dielectric includes a high-k dielectric material, the IC further comprising: a source region and a drain region each comprising one or both of silicon and germanium, wherein the nanowire extends at least between the source region and the drain region.

12. An integrated circuit (IC) comprising:
    a transistor including
    a source region and a drain region;
    a nanowire extending at least between the source region and the drain region, the nanowire above a fin, wherein the nanowire includes a semiconductor material comprising an alloy of carbon and a group IV semiconductor, such that carbon constitutes less than 5 percent of total atomic percentage of the nanowire, wherein the first and second source or drain structures comprise a semiconductor material different than the semiconductor material of the nanowire, and wherein the semiconductor material of the first and second source or drain structures is on the fin, and
    a gate structure wrapped around the nanowire, the gate structure including a gate electrode and a gate dielectric, the gate dielectric on the nanowire and between the nanowire and the gate electrode.

13. The IC of claim 12, wherein the nanowire includes at least one of silicon (Si) or germanium (Ge).

14. The IC of claim 12, wherein the first group IV semiconductor included in the nanowire is silicon (Si).

15. The IC of claim 12, wherein the first group IV semiconductor included in the nanowire is germanium (Ge).

16. The IC of claim 12, wherein the first group IV semiconductor included in the nanowire comprises silicon (Si) and germanium (Ge).

17. The IC of claim 12, wherein carbon constitutes less than 2 percent of total atomic percentage of the nanowire.

18. A method of forming an integrated circuit (IC), the method comprising:
    forming a multilayer fin-shaped stack, the multilayer fin-shaped stack including a first layer and a second layer below or above the first layer, the first and second layers including first and second group IV semiconductor materials, respectively, wherein at least one of the first and second group IV semiconductor materials is an alloy of carbon (C), such that carbon constitutes less than 5 percent of total atomic percentage of the at least one of the first and second layers;
    performing selective etch processing to at least partially remove one of the first layer or second layer to form a nanowire above a fin, wherein the nanowire includes a semiconductor material comprising an alloy of carbon and a group IV semiconductor, such that carbon constitutes less than 5 percent of total atomic percentage of the nanowire;

forming a gate structure that wraps around the nanowire; and forming a first source or drain structure at a first end of the nanowire and a second source or drain structure at a second end of the nanowire, wherein the first and second source or drain structures comprise a semiconductor material different than the semiconductor material of the nanowire, and wherein the semiconductor material of the first and second source or drain structures is on the fin.

19. The method of claim 18, wherein the selective etch processing includes using a given etchant that removes exposed portions of the first or second layer at a rate of at least 2 times faster than a rate at which the given etchant removes exposed portions of the other of the first or second layer.

20. The method of claim 18, wherein carbon constitutes less than 2 percent of total atomic percentage of the at least one of the first and second layers.

* * * * *